(12) United States Patent
Tsai

(10) Patent No.: US 12,317,571 B2
(45) Date of Patent: May 27, 2025

(54) SEMICONDUCTOR DEVICE AND METHOD FOR MANUFACTURING THE SAME

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 419 days.

(21) Appl. No.: 17/844,961

(22) Filed: Jun. 21, 2022

(65) Prior Publication Data

US 2023/0411475 A1    Dec. 21, 2023

(51) Int. Cl.
*H10D 64/27* (2025.01)
*H10B 12/00* (2023.01)

(52) U.S. Cl.
CPC .......... *H10D 64/513* (2025.01); *H10B 12/34* (2023.02)

(58) Field of Classification Search
CPC ..... H10D 64/513; H10B 12/34; H10B 12/315
See application file for complete search history.

(56) References Cited

U.S. PATENT DOCUMENTS

| | | | |
|---|---|---|---|
| 10,985,255 B2* | 4/2021 | Huh | H10D 30/0221 |
| 11,444,087 B2* | 9/2022 | Su | H10B 12/482 |
| 11,462,623 B2* | 10/2022 | Huh | H10D 30/0221 |
| 11,638,375 B2* | 4/2023 | Su | H10B 12/0335 |
| | | | 257/334 |
| 11,955,525 B2* | 4/2024 | Huh | H10D 30/60 |
| 12,113,113 B2* | 10/2024 | Chang | H10D 30/6735 |
| 2013/0052787 A1 | 2/2013 | Lee et al. | |
| 2015/0214220 A1* | 7/2015 | Seo | H10D 84/0147 |
| | | | 257/499 |
| 2017/0365608 A1* | 12/2017 | Lee | H10D 64/513 |
| 2018/0053769 A1* | 2/2018 | Kim | H10B 12/315 |
| 2020/0152753 A1* | 5/2020 | Huh | H10D 30/60 |
| 2021/0183689 A1 | 6/2021 | Kang et al. | |
| 2021/0242320 A1* | 8/2021 | Huh | H10D 84/038 |
| 2021/0335792 A1* | 10/2021 | Su | H10B 12/482 |
| 2022/0013649 A1* | 1/2022 | Lee | H10D 62/116 |
| 2022/0077154 A1 | 3/2022 | Kim et al. | |
| 2022/0102355 A1* | 3/2022 | Su | H10B 12/482 |
| 2023/0006046 A1* | 1/2023 | Huh | H01L 21/76877 |
| 2023/0029739 A1* | 2/2023 | Chang | H10D 84/83 |

(Continued)

FOREIGN PATENT DOCUMENTS

| | | | | |
|---|---|---|---|---|
| CN | 105656992 A | * | 6/2016 | |
| CN | 117276327 A | * | 12/2023 | ......... H01L 29/4236 |

(Continued)

OTHER PUBLICATIONS

Office Action and and the search report mailed on Jul. 31, 2024 related to Taiwanese Application No. 113111711.

(Continued)

*Primary Examiner* — Laura M Menz
(74) *Attorney, Agent, or Firm* — Xuan Zhang

(57) ABSTRACT

A semiconductor device is provided. The semiconductor device includes a substrate having a trench and a gate structure in the trench. The trench includes an upper gate electrode, a capping layer on the upper gate electrode and a first dielectric layer partially disposed between the upper gate electrode and the capping layer.

10 Claims, 24 Drawing Sheets

(56) References Cited

U.S. PATENT DOCUMENTS

| | | | |
|---|---|---|---|
| 2023/0282518 A1* | 9/2023 | Kim | H01L 21/76877 438/197 |
| 2023/0290848 A1* | 9/2023 | Kim | H01L 21/76829 |
| 2023/0328970 A1* | 10/2023 | Lai | H10D 64/666 257/213 |
| 2023/0378263 A1* | 11/2023 | Jang | H10D 30/43 |
| 2023/0403844 A1* | 12/2023 | Kim | H10B 12/488 |
| 2023/0411475 A1* | 12/2023 | Tsai | H10D 64/513 |
| 2023/0411476 A1* | 12/2023 | Tsai | H10B 12/053 |
| 2024/0014278 A1* | 1/2024 | Tsai | H10D 30/63 |
| 2024/0014314 A1* | 1/2024 | Tsai | H10B 12/053 |
| 2024/0015947 A1* | 1/2024 | Tsai | H10B 12/053 |
| 2024/0015951 A1* | 1/2024 | Tsai | H10B 12/34 |
| 2024/0021690 A1* | 1/2024 | Tsai | H10D 62/107 |
| 2024/0021691 A1* | 1/2024 | Tsai | H10D 64/01 |
| 2024/0098978 A1* | 3/2024 | Tsai | H10B 12/34 |
| 2024/0098979 A1* | 3/2024 | Tsai | H10B 12/34 |
| 2024/0105773 A1* | 3/2024 | Yu | H10D 30/6735 |
| 2024/0147700 A1* | 5/2024 | Kang | H10B 12/488 |
| 2024/0213342 A1* | 6/2024 | Huh | H10D 84/038 |
| 2024/0357802 A1* | 10/2024 | Park | H10B 12/485 |
| 2024/0371959 A1* | 11/2024 | Chang | H10D 30/6735 |

FOREIGN PATENT DOCUMENTS

| | | | | |
|---|---|---|---|---|
| CN | 117393590 A | * | 1/2024 | H01L 29/4236 |
| TW | 202220172 A | | 5/2022 | |
| TW | 202224188 A | | 6/2022 | |
| TW | 202431947 A | * | 8/2024 | H01L 29/4236 |

OTHER PUBLICATIONS

Office Action and and the search report mailed on Dec. 19, 2023 related to Taiwanese Application No. 112103662.

Office Action and and the search report mailed on Nov. 21, 2024 related to U.S. Appl. No. 17/845,871.

* cited by examiner

SEMICONDUCTOR DEVICE AND METHOD FOR MANUFACTURING THE SAME

TECHNICAL FIELD

The present disclosure relates to a semiconductor device, and more particularly, to a buried gate structure having a dielectric layer between an electrode and a capping layer.

DISCUSSION OF THE BACKGROUND

A buried gate structure of a semiconductor device includes a gate dielectric layer and a gate electrode in a trench. The gate dielectric layer covers the surface of the trench and the gate electrode partially fills the trench on the gate dielectric layer. The buried gate structure may be adjacent to (or on the same level as) impurity regions or junction regions in an active region of the semiconductor device.

Gate induced drain leakage (GIDL) may increase where the gate electrode and the impurity regions overlap. GIDL discharges the stored charges, thereby deteriorating the operational reliability of the semiconductor device. Moreover, a portion of a buried gate structure of the semiconductor device may be disposed in an isolation region of the semiconductor device, which is referred to as a passing gate. The passing gate may exacerbate the occurrence of GIDL.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate having a trench and a gate structure in the trench. The gate structure includes an upper gate electrode, a capping layer on the upper gate electrode and a first dielectric layer partially disposed between the upper gate electrode and the capping layer.

Another aspect of the present disclosure provides a semiconductor device. The semiconductor device includes a substrate having a trench and a gate structure in the trench. The gate structure includes an upper gate electrode and a capping layer on the upper gate electrode. A distance between the capping layer and the substrate is greater than a distance between the upper gate electrode and the substrate.

Another aspect of the present disclosure provides a method of manufacturing a semiconductor device. The method includes forming a trench in a substrate and disposing an upper gate electrode in the trench. The method also includes disposing a first dielectric layer on the upper gate electrode in the trench and disposing a capping layer on the first dielectric layer in the trench.

Forming a thicker dielectric layer in the trench may reduce the effective electric field and consequently reduce GIDL. Therefore, interference between word-lines in different memory cells can be avoided. A data retention time can be extended, and the operational reliability of the semiconductor device can also be improved.

In addition, the gate structure also includes a lower gate electrode and a dielectric layer between the lower gate electrode and the substrate. The dielectric layer between the lower gate electrode and the substrate can have a constant thickness, which helps to optimize the subthreshold swing and decrease the threshold voltage. Therefore, the channel ions can be increased. For example, number, amount, density or flow of electron between doped regions can be increased. For example, the channel ions can be increased by 20%, 40%, 60% or more assuming that the external resistance and the internal trap charges (or the internal trap density) are constant.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
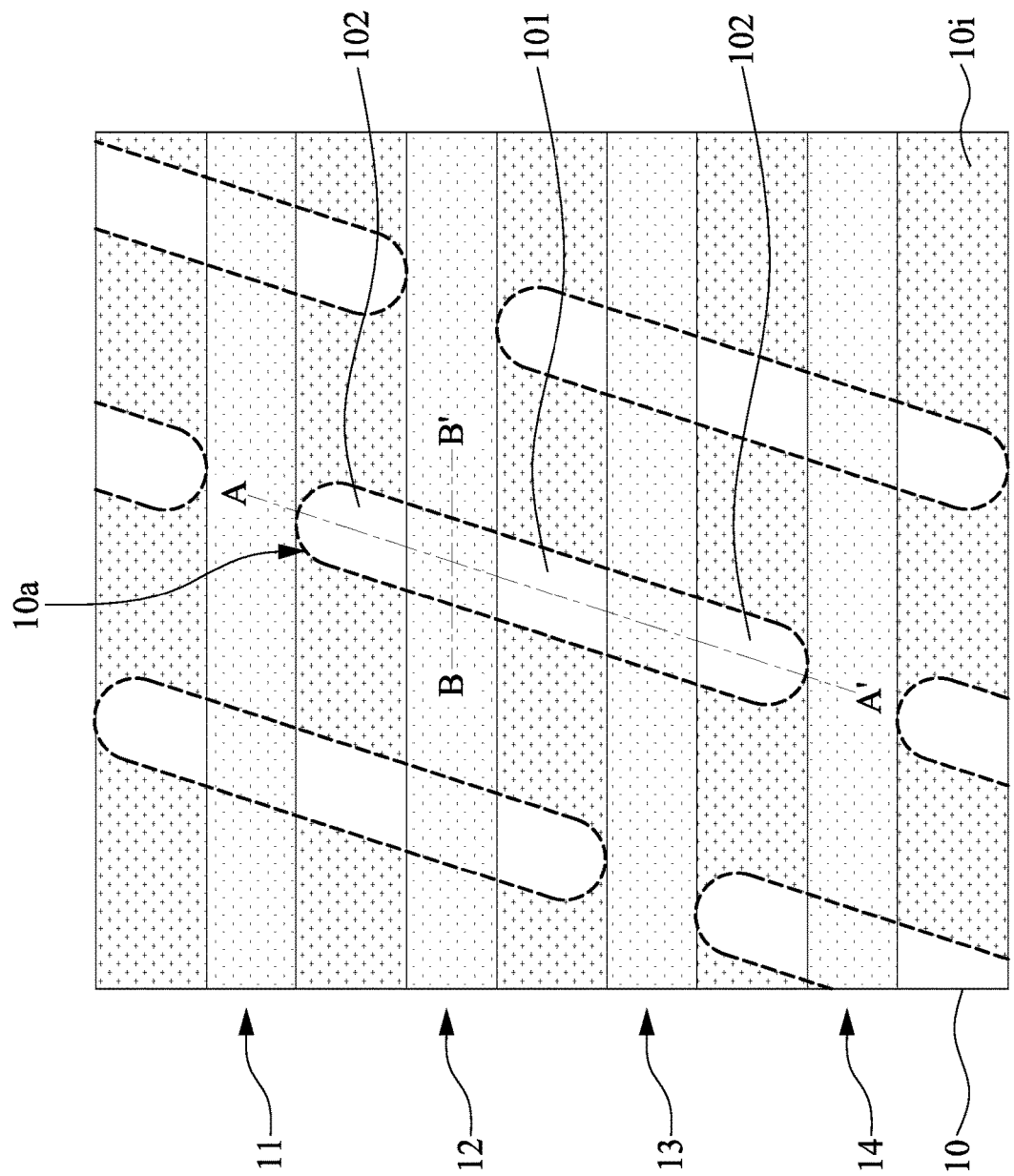
FIG. 1A is a schematic plane view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that features of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic plane view of a semiconductor device 1 in accordance with some embodiments of the present disclosure.

In some embodiments, the semiconductor device 1 may be disposed adjacent to a circuit. For example, the semiconductor device 1 may be disposed adjacent to a memory device such as a dynamic random access memory (DRAM) device or the like.

Referring to FIG. 1A, the semiconductor device 1 may include a plurality of active regions 10a and an isolation region 10i (or an isolation layer) formed on a substrate 10. The active regions 10a may be defined by the isolation region 10i.

The semiconductor device 1 may also include a plurality of gate structures, such as the gate structures 11, 12, 13 and 14. Each active region 10a may cross two gate structures and may be divided into three doped regions by the two gate structures. For example, the active region 10a may be divided into the first doped region 101 disposed between the two gate structures 12 and 13 and second doped regions 102 located at two sides of the first doped region 101.

Figure 1B:
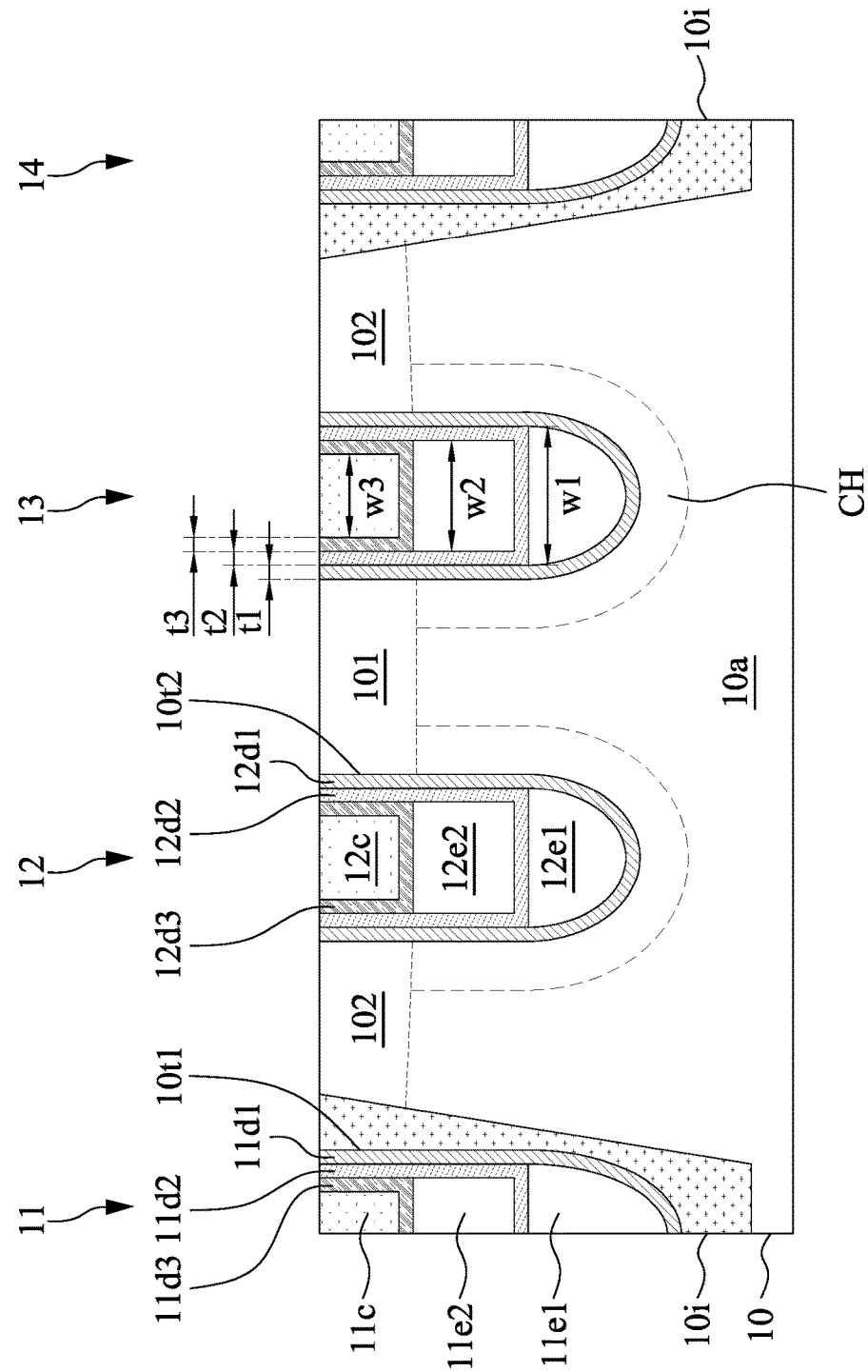
FIG. 1B is a schematic cross-sectional view illustrating the semiconductor device taken along an A-A' line shown in FIG. 1A.
Figure 1C:
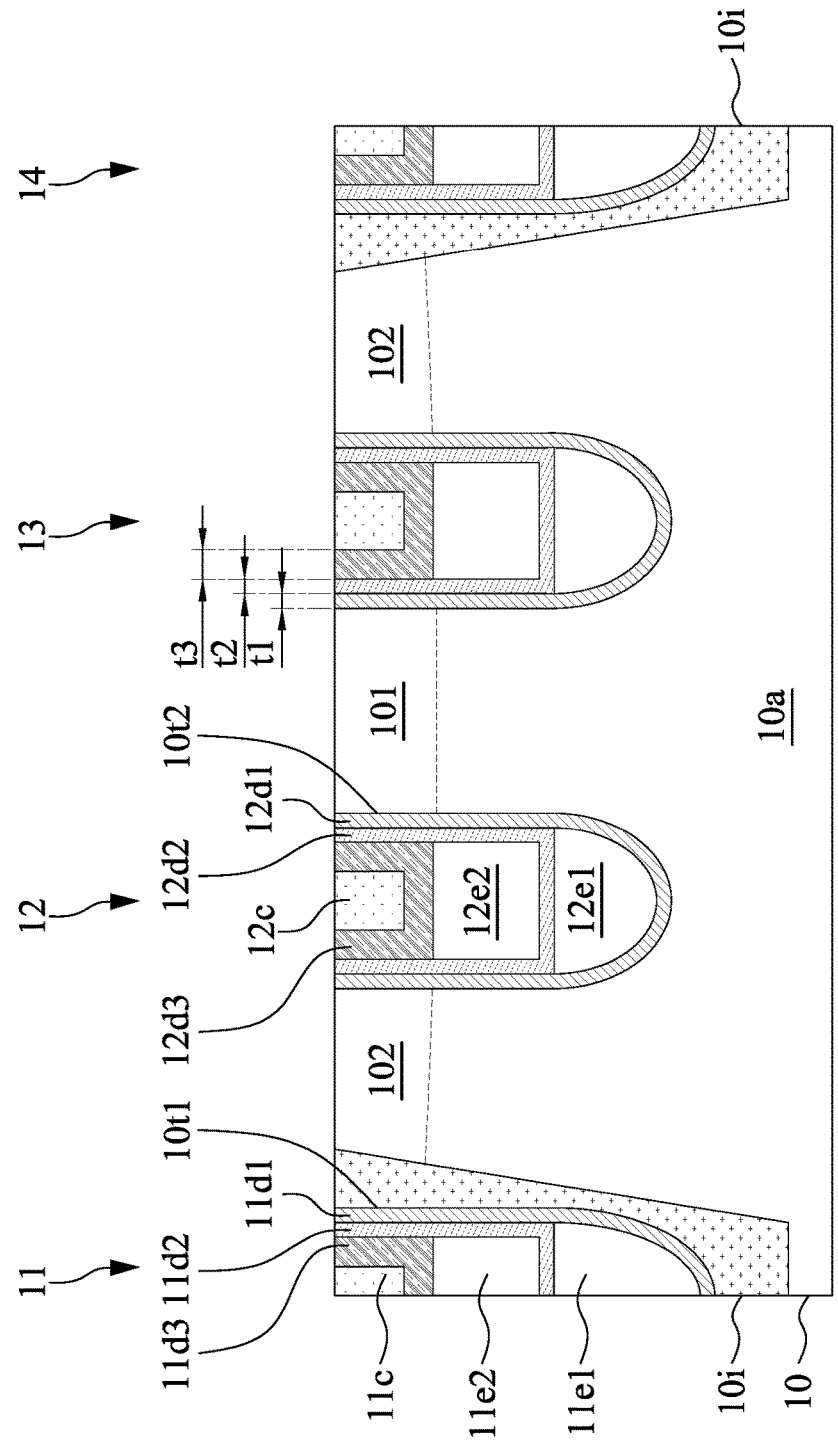
FIG. 1C is a schematic cross-sectional view illustrating the semiconductor device taken along an A-A' line shown in FIG. 1A.

The gate structures 11, 12, 13 and 14 may each have a line shape extending in any one direction. The gate structures 11, 12, 13 and 14 may each be a buried gate buried in a trench that runs through the active regions 10a and the isolation region 10i. The gate structures 11, 12, 13 and 14 may each include one or more main gate parts (or main gates) buried in the active regions 10a and one or more passing gate parts (or passing gates) buried in the isolation region 10i. For example, FIG. 1B (further described below) shows a passing gate of the gate structure 11, a main gate of the gate structure 12, a main gate of the gate structure 13 and a passing gate of the gate structure 14. FIG. 1C (further described below) shows a trench 10t2 (where the gate structure 12 is disposed) that runs through one of the active regions 10a and the isolation region 10i. The portion of the gate structure 12 over the active region 10a is a main gate.

As used herein, the term "main gate" refers to a gate that is configured to receive a voltage to address a memory cell, and the term "passing gate" refers to a gate that is configured to receive a voltage to address an adjacent memory cell. For example, the gate structure 11 may be a passing gate in one memory cell shown in FIG. 1B, but become a main gate in another memory cell. In some embodiments, the gate structure 12 may be a main gate in one memory cell shown in FIG. 1B, but become a passing gate in yet another memory cell.

Although the main gate and the passing gate are both described above as being parts or portions of the gate structure, the main gate and the passing gate have different structures. For example, as shown in FIG. 1B, the trench 10t1 for the passing gate part of the gate structure 11 and the trench 10t2 for the main gate part of the gate structure 12 have different depths. The trench 10t1 may be deeper than the trench 10t2.

FIG. 1B is a schematic cross-sectional view illustrating the semiconductor device 1 taken along an A-A' line shown in FIG. 1A.

Referring to FIG. 1B, the semiconductor device 1 may include the substrate 10, and the gate structures 11, 12, 13 and 14 formed in the substrate 10.

The substrate 10 may include a semiconductor substrate. In some embodiments, the substrate 10 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10 may include a layered semiconductor such as silicon/silicon germanium, silicon-on-insulator, or silicon germanium-on-insulator.

The active region 10a and the isolation region 10i may be formed in the substrate 10. The active region 10a may be defined by the isolation region 10i. In some embodiments, the isolation region 10i may include shallow trench isolation (STI) structures. The STI structures may include, for example, silicon oxide ($SiO_2$), silicon nitride ($Si_3N_4$), silicon oxynitride ($N_2OSi_2$), silicon nitride oxide ($N_2OSi_2$), etc.

The first doped region 101 and the second doped regions 102 may be formed in the active region 10a. In some embodiments, the first doped region 101 and the second doped regions 102 may be disposed over or proximal to the top surface of the active region 10a. The first doped region 101 and the second doped region 102 may be located on both sides of the trench 10t2.

A channel region CH may be formed between the first doped region 101 and the second doped region 102. The channel region CH may be located below the gate structure 12 and/or the gate structure 13.

In some embodiments, the first doped region 101 and the second doped region 102 may be doped with an N-type dopant such as phosphorus (P), arsenic (As), or antimony (Sb). In some other embodiments, the first doped region 101 and the second doped region 102 may be doped with a P-type dopant such as boron (B) or indium (In). In some embodiments, the first doped region 101 and the second doped region 102 may be doped with dopants or impurity ions having the same conductivity types. In some embodiments, the first doped region 101 and the second doped region 102 may be doped with dopants or impurity ions having different conductivity types.

The bottom surfaces of the first doped region 101 and the second doped region 102 may be located at a predetermined depth from the top surface of the active region 10a. The first doped region 101 and the second doped region 102 may contact sidewalls of the trench 10t2. The bottom surfaces of the first doped region 101 and the second doped region 102 may be higher than the bottom surface of the trench 10t2. Similarly, the bottom surfaces of the first doped region 101 and the second doped region 102 may be higher than the bottom surface of the trench 10t1.

In some embodiments, the first doped region 101 and the second doped region 102 may be referred to as source/drain regions. In some embodiments, the first doped region 101 may include a bit-line contact region and may be electrically connected with a bit-line structure (such as the bit-line structure 32 shown in FIG. 3). The second doped region 102 may include a storage node junction region and may be electrically connected with a memory element (such as the memory element 34 shown in FIG. 3).

The trench 10t1 in the isolation region 10i and the trench 10t2 in the active region 10a are spaces in which the gate structures 11 and 12 may be formed. The gate structure 11 in the isolation region 10i may include a passing gate. The gate structure 12 in the active region 10a may include a main gate.

The trench 10t2 may have a shallower depth than the trench 10t1. The bottom of the trenches 10t1 and 10t2 may each have a curvature as shown in the embodiment of FIG. 1B. However, in some other embodiments, the bottom of the trenches 10t1 and 10t2 may be flat or may have other shapes.

The gate structure 12 may include dielectric layers 12d1, 12d2, 12d3, gate electrodes 12e1, 12e2, and a capping layer 12c.

The dielectric layer 12d1 may be conformally formed on the bottom surface and sidewall of the trench 10t2. The dielectric layer 12d1 may surround or cover a part of the gate electrode 12e1. The dielectric layer 12d1 may separate the gate electrode 12e1 from the substrate 10.

A part (e.g., a sidewall or an extending portion) of the dielectric layer 12d1 may be disposed between the gate electrode 12e2 and the substrate 10. A part (e.g., a bottom or a base portion) of the dielectric layer 12d1 may be disposed between the gate electrode 12e1 and the substrate 10.

In some embodiments, the dielectric layer 12d1 may have a thickness t1 ranging from approximately 4.0 nanometers (nm) to approximately 6.0 nm.

In some embodiments, the dielectric layer 12d1 may have a constant thickness. For example, the thickness of the sidewall (or the extending portion) of the dielectric layer 12d1 between the gate electrode 12e2 and the substrate 10 and the bottom (or the base portion) of the dielectric layer 12d1 between the gate electrode 12e1 and the substrate 10 may be substantially equal.

In some embodiments, the thickness of the sidewall (or the extending portion) of the dielectric layer 12d1 between the gate electrode 12e2 and the substrate 10 and the thickness of the bottom (or the base portion) of the dielectric layer 12d1 between the gate electrode 12e1 and the substrate 10 may both be about 4.0 nm, 5.0 nm or 6.0 nm.

In some embodiments, the dielectric layer 12d1 may have different thicknesses. For example, the thickness of the sidewall (or the extending portion) of the dielectric layer 12d1 between the gate electrode 12e2 and the substrate 10 may be greater than the thickness of the bottom (or the base portion) of the dielectric layer 12d1 between the gate electrode 12e1 and the substrate 10. For example, the thickness of the sidewall (or the extending portion) of the dielectric layer 12d1 between the gate electrode 12e2 and the substrate 10 may be less than the thickness of the bottom (or the base portion) of the dielectric layer 12d1 between the gate electrode 12e1 and the substrate 10.

In some embodiments, the dielectric layer 12d1 may include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. Examples of the high-k material include a dielectric material having a dielectric constant that is higher than that of silicon dioxide ($SiO_2$), or a dielectric material having a dielectric constant higher than about 3.9. In some embodiments, the dielectric layer 12d1 may include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

The dielectric layer 12*d*2 may be disposed on the gate electrode 12*e*1. The dielectric layer 12*d*2 may be partially disposed between the gate electrodes 12*e*1 and 12*e*2. For example, the dielectric layer 12*d*2 may have a base portion between the gate electrodes 12*e*1 and 12*e*2 and an extending portion extending from the base portion to the top surface of the active region 10*a*.

In some embodiments, the dielectric layer 12*d*2 may have a thickness t2 ranging from approximately 1.5 nm to approximately 3.0 nm. In some embodiments, the thickness t2 of the dielectric layer 12*d*2 may be less than the thickness t1 of the dielectric layer 12*d*1.

In some embodiments, the dielectric layer 12*d*2 may have a constant thickness. For example, the thickness of the extending portion of the dielectric layer 12*d*2 and the base portion of the dielectric layer 12*d*2 may be substantially equal.

In some embodiments, the thickness of the extending portion of the dielectric layer 12*d*2 and the base portion of the dielectric layer 12*d*2 may both be about 1.5 nm, 3.0 nm or other amount between 1.5 nm and 3.0 nm.

In some embodiments, the dielectric layer 12*d*2 may have different thicknesses. For example, the thickness of the extending portion of the dielectric layer 12*d*2 may be greater than the base portion of the dielectric layer 12*d*2. For example, the thickness of the extending portion of the dielectric layer 12*d*2 may be less than the base portion of the dielectric layer 12*d*2.

The base portion of the dielectric layer 12*d*2 may directly contact the gate electrodes 12*e*1 and 12*e*2. The base portion of the dielectric layer 12*d*2 may be sandwiched between the gate electrodes 12*e*1 and 12*e*2. The base portion of the dielectric layer 12*d*2 may be covered or embedded by the gate electrodes 12*e*1 and 12*e*2.

The extending portion of the dielectric layer 12*d*2 may cover or contact a part of the dielectric layer 12*d*1.

The extending portion of the dielectric layer 12*d*2 may be disposed between the gate electrode 12*e*2 and the dielectric layer 12*d*1 and between the dielectric layer 12*d*3 and the dielectric layer 12*d*1. The extending portion of the dielectric layer 12*d*2 may be spaced apart from the substrate 10 by the dielectric layer 12*d*1. The extending portion of the dielectric layer 12*d*2 may be spaced apart from the capping layer 12*c* by the dielectric layer 12*d*3.

The dielectric layer 12*d*2 may surround or cover a part of the gate electrode 12*e*2. The dielectric layer 12*d*1 and the extending portion of the dielectric layer 12*d*2 may separate the gate electrode 12*e*2 from the substrate 10. Therefore, the distance (i.e., the thickness t2 and the thickness t1) between the gate electrode 12*e*2 and the substrate 10 may be greater than the distance (i.e., the thickness t1) between the gate electrode 12*e*1 and the substrate 10. For example, the gate electrode 12*e*2 and the gate electrode 12*e*1 may be spaced apart from the substrate 10 by different distances.

The dielectric layer 12*d*3 may be disposed on the gate electrode 12*e*2. The dielectric layer 12*d*2 may be partially disposed between the gate electrode 12*e*2 and the capping layer 12*c*. For example, the dielectric layer 12*d*3 may have a base portion between the gate electrode 12*e*2 and the capping layer 12*c* and an extending portion extending from the base portion to the top surface of the active region 10*a*.

In some embodiments, the dielectric layer 12*d*3 may have a thickness t3 ranging from approximately 1.5 nm to approximately 3.0 nm. In some embodiments, the thickness t3 of the dielectric layer 12*d*3 may be less than the thickness t1 of the dielectric layer 12*d*1.

In some embodiments, the dielectric layer 12*d*3 may have a constant thickness. For example, the thickness of the extending portion of the dielectric layer 12*d*3 and the base portion of the dielectric layer 12*d*3 may be substantially equal.

In some embodiments, the thickness of the extending portion of the dielectric layer 12*d*3 and the thickness of the base portion of the dielectric layer 12*d*3 may both be about 1.5 nm, 3.0 nm or other amount between 1.5 nm and 3.0 nm.

In some embodiments, the dielectric layer 12*d*3 may have different thicknesses. For example, the thickness of the extending portion of the dielectric layer 12*d*3 may be greater than the thickness of the base portion of the dielectric layer 12*d*3. For example, the thickness of the extending portion of the dielectric layer 12*d*3 may be less than the thickness of the base portion of the dielectric layer 12*d*3.

In some embodiments, the thickness t3 of the dielectric layer 12*d*3 and the thickness t2 of the dielectric layer 12*d*2 may be substantially equal. For example, the thickness t3 of the dielectric layer 12*d*3 and the thickness t2 of the dielectric layer 12*d*2 may both be about 1.5 nm, 3.0 nm or other amount between 1.5 nm and 3.0 nm.

For example, the thickness of the extending portion of the dielectric layer 12*d*3 and the thickness of the extending portion of the dielectric layer 12*d*2 may be substantially equal. For example, the thickness of the base portion of the dielectric layer 12*d*3 and the thickness of the base portion of the dielectric layer 12*d*2 may be substantially equal.

The base portion of the dielectric layer 12*d*3 may directly contact the gate electrode 12*e*2 and the capping layer 12*c*. The base portion of the dielectric layer 12*d*3 may be sandwiched between the gate electrode 12*e*2 and the capping layer 12*c*. The base portion of the dielectric layer 12*d*3 may be covered or embedded by the gate electrode 12*e*2 and the capping layer 12*c*.

The extending portion of the dielectric layer 12*d*3 may cover or contact a part of the dielectric layer 12*d*2.

The extending portion of the dielectric layer 12*d*3 may be disposed between the capping layer 12*c* and the dielectric layer 12*d*2. The extending portion of the dielectric layer 12*d*3 may be spaced apart from the dielectric layer 12*d*1 by the dielectric layer 12*d*2.

The dielectric layer 12*d*3 may surround or cover a part of the capping layer 12*c*.

The dielectric layer 12*d*1, the dielectric layer 12*d*2 and the dielectric layer 12*d*3 may separate the capping layer 12*c* from the substrate 10. Therefore, the distance (i.e., the thickness t3, the thickness t2 and the thickness t1) between the capping layer 12*c* and the substrate 10 may be greater than the distance (i.e., the thickness t1) between the gate electrode 12*e*1 and the substrate 10. Therefore, the distance (i.e., the thickness t3, the thickness t2 and the thickness t1) between the capping layer 12*c* and the substrate 10 may be greater than the distance (i.e., the thickness t2 and the thickness t1) between the gate electrode 12*e*2 and the substrate 10. For example, the gate electrode 12*e*2, the gate electrode 12*e*1 and the capping layer 12*c* may be spaced apart from the substrate 10 by different distances.

Any two of a surface of the dielectric layer 12*d*1, a surface of the extending portion of the dielectric layer 12*d*2, a surface of the extending portion of the dielectric layer 12*d*3, a surface of capping layer 12*c*, and the top surface of the active region 10*a* may be substantially coplanar.

The material that the dielectric layer 12*d*2 is made of may be the same as or different from that of the dielectric layer 12d1. Similarly, the material that the dielectric layer 12d3 is made of may be the same as or different from that of the dielectric layer 12d1.

In some embodiments, the dielectric layer 12d2 and the dielectric layer 12d1 may have the same material formed by different operations. Similarly, the dielectric layer 12d3 and the dielectric layer 12d1 may have the same material formed by different operations For example, the dielectric layer 12d1 may be formed by a thermal oxidation operation. The dielectric layer 12d2 may be formed by an atomic layer deposition (ALD) process. The dielectric layer 12d3 may be formed by an ALD process In some embodiments, the dielectric layer 12d1 and the dielectric layer 12d2 may have different densities, such as different particle densities. For example, a density of the dielectric layer 12d1 may be lower than a density of the dielectric layer 12d2. A density of the dielectric layer 12d2 may be higher than a density of the dielectric layer 11d1. For example, the dielectric layer 12d2 may be denser than the dielectric layer 12d1.

In some embodiments, the dielectric layer 12d1 and the dielectric layer 12d3 may have different densities, such as different particle densities. For example, a density of the dielectric layer 12d1 may be lower than a density of the dielectric layer 12d3. A density of the dielectric layer 12d3 may be higher than a density of the dielectric layer 11d1. For example, the dielectric layer 12d3 may be denser than the dielectric layer 12d1. In some embodiments, the dielectric layer 12d2 and the dielectric layer 12d3 may have the same density.

The gate electrode 12e1 may be disposed on the dielectric layer 12d1 and spaced apart from the substrate 10 by the dielectric layer 12d1. The gate electrode 12e1 may be spaced apart from the substrate 10 by a distance (i.e., the thickness t1). In some embodiments, the gate electrode 12e1 may be spaced apart from the substrate 10 by a distance ranging from approximately 4.0 nm to approximately 6.0 nm.

The gate electrode 12e1 may be surrounded or covered by the dielectric layer 12d1 and the dielectric layer 12d2. The gate electrode 12e1 may also be referred to as a lower gate electrode with respect to the gate electrode 12e2.

In some embodiments, the gate electrode 12e1 may include a single layer of metal, metal composite or layers of conductive materials. In some embodiments, the gate electrode 12e1 may include a metal-based material. For example, the gate electrode 12e1 may include titanium (Ti), titanium nitride (TiN), tantalum (Ta), tantalum nitride (TaN), tungsten (W), tungsten nitride (WN), a stack thereof or a combination thereof.

The gate electrode 12e2 may be disposed on the dielectric layer 12d2 and spaced apart from the gate electrode 12e1 by the dielectric layer 12d2. The gate electrode 12e2 may be spaced apart from the substrate 10 by the dielectric layer 12d1 and the dielectric layer 12d2. The gate electrode 12e2 may be spaced apart from the substrate 10 by a distance (i.e., the thickness t1 and the thickness t2). In some embodiments, the gate electrode 12e2 may be spaced apart from the substrate 10 by a distance ranging from approximately 5.5 nm to approximately 9.0 nm, such as approximately 7.0 nm or approximately 7.5 nm.

The gate electrode 12e2 may be spaced apart from the second doped region 102 by a distance (i.e., the thickness t1 and the thickness t2). The gate electrode 12e2 may be spaced apart from the first doped region 101 by a distance (i.e., the thickness t1 and the thickness t2).

The gate electrode 12e2 may be surrounded or covered by the dielectric layer 12d2 and the dielectric layer 12d3. The gate electrode 12e2 may also be referred to as an upper gate electrode with respect to the gate electrode 12e1.

In some embodiments, the gate electrode 12e2 may include a single layer of metal, metal composite or layers of conductive materials. In some embodiments, the gate electrode 12e2 may include polycrystalline silicon (poly-Si), titanium nitride (TiN), tungsten nitride (WN), or the like.

In some embodiments, a width w1 of the gate electrode 12e1 may be greater than a width w2 of the gate electrode 12e2.

In some embodiments, the gate electrodes 12e1 and 12e2 may function as word-lines. For example, the gate electrodes 12e1 and 12e2 may be used with bit-lines (such as the bit-line structure 32 shown in FIG. 3) to address memory cells. For example, the gate electrode 12e2 may function as a gate electrode of a transistor in a memory cell. The second doped region 102 and the first doped region 101 may function as a drain region and a source region of the transistor. The second doped region 102 may be coupled to a capacitor or a memory element (such as the memory element 34 shown in FIG. 3) and the first doped region 101 may be coupled to a bit-line (such as the bit-line structure 32 shown in FIG. 3). The transistor may retain charge in the capacitor.

In some embodiments, the gate electrode 12e2 may have a low work function. In some embodiments, the gate electrode 12e1 may have a high work function. The high work function refers to a work function higher than a mid-gap work function of silicon. A low work function refers to a work function lower than the mid-gap work function of silicon. Specifically, the high work function may be higher than 4.5 eV, and the low work function may be lower than 4.5 eV.

In some embodiments, the gate electrodes 12e1 and 12e2 may be configured to receive different voltages. In some embodiments, a voltage applied on the gate electrode 12e1 may be greater than a voltage applied on the gate electrode 12e2. In some embodiments, a voltage difference between the gate electrodes 12e1 and 12e2 may be greater than 0.3 volts (V). In some embodiments, the gate electrodes 12e1 and 12e2 may be configured to address different memory cells.

The capping layer 12c may be disposed on the dielectric layer 12d3 and spaced apart from the gate electrode 12e2 by the dielectric layer 12d3. The capping layer 12c may be spaced apart from the substrate 10 by the dielectric layer 12d1, the dielectric layer 12d2 and the dielectric layer 12d3. The capping layer 12c may be spaced apart from the substrate 10 by a distance (i.e., the thickness t1, the thickness t2 and the thickness t3). In some embodiments, the capping layer 12c may be spaced apart from the substrate 10 by a distance ranging from approximately 7.0 nm to approximately 12.0 nm, such as approximately 10.0 nm or approximately 9.0 nm.

The capping layer 12c may be surrounded or covered by the dielectric layer 12d3. The capping layer 12c may contact the extending portion of the dielectric layer 12d3. The capping layer 12c may be spaced apart from the dielectric layer 12d2 by the dielectric layer 12d3. The capping layer 12c may serve to protect the gate electrode 12e2. The capping layer 12c may have a surface substantially coplanar with the top surface of the active region 10a.

In some embodiments, the width w1 of the gate electrode 12e1 may be greater than a width w3 of the capping layer 12c. In some embodiments, the width w2 of the gate electrode 12e2 may be greater than the width w3 of the capping layer 12c. In other words, the width w3 of the capping layer 12c may be less than the width w2 of the gate electrode 12e2. The width w3 of the capping layer 12c may be less than the width w1 of the gate electrode 12e1.

In some embodiments, the capping layer 12c may include a dielectric material, such as silicon oxide ($SiO_2$), silicon nitride ($Si_3N_4$), silicon oxynitride ($N_2OSi_2$), and silicon nitride oxide ($N_2OSi_2$). In some embodiments, the capping layer 12c may include a silicon nitride liner and a spin-on-dielectric (SOD) material.

The gate structure 11 may include dielectric layers 11d1, 11d2, 11d3, gate electrodes 11e1, 11e2, and a capping layer 11c. The gate structure 11 has a structure similar to the structure of the gate structure 12, except that the gate structure 11 is disposed in the isolation region 101.

FIG. 1C is a schematic cross-sectional view illustrating the semiconductor device taken along an A-A' line shown in FIG. 1A. The structure of FIG. 1C is similar to the structure of FIG. 1B, except for the differences described below.

In some embodiments, the thickness t3 of the dielectric layer 12d3 may be greater than the thickness t2 of the dielectric layer 12d2. For example, the thickness t3 of the dielectric layer 12d3 may be substantially double the thickness t2 of the dielectric layer 12d2. For example, the thickness t3 of the dielectric layer 12d3 may be about 3.0 nm and the thickness t2 of the dielectric layer 12d2 may be about 1.5 nm.

In some embodiments, the capping layer 12c may be spaced apart from the substrate 10 by a distance ranging from approximately 8.5 nm to approximately 10.5 nm.

Figure 1D:
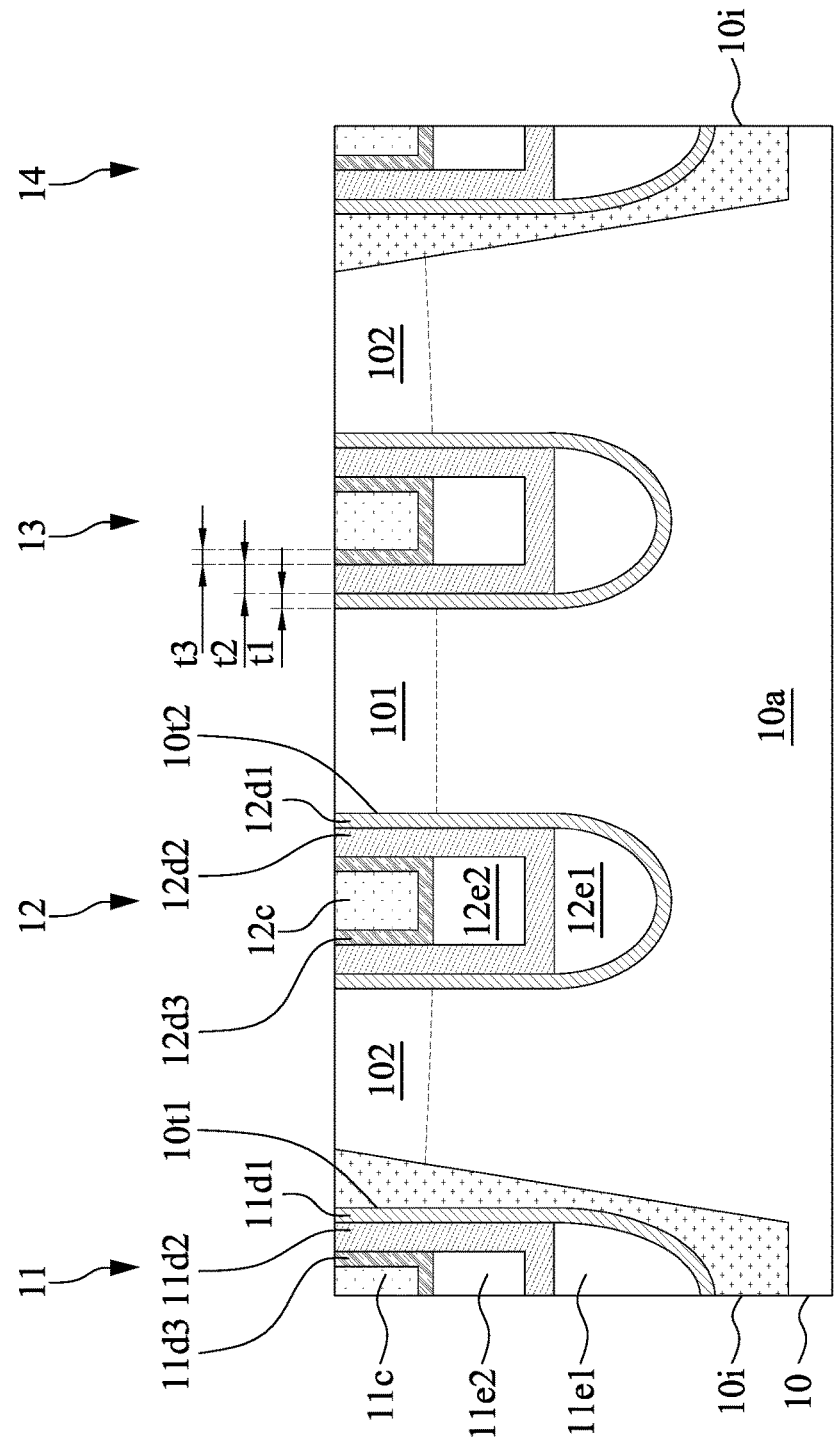
FIG. 1D is a schematic cross-sectional view illustrating the semiconductor device taken along an A-A' line shown in FIG. 1A.

FIG. 1D is a schematic cross-sectional view illustrating the semiconductor device taken along an A-A' line shown in FIG. 1A. The structure of FIG. 1D is similar to the structure of FIG. 1B, except for the differences described below.

In some embodiments, the thickness t2 of the dielectric layer 12d2 may be greater than the thickness t3 of the dielectric layer 12d3. For example, the thickness t2 of the dielectric layer 12d2 may be substantially double the thickness t3 of the dielectric layer 12d3. For example, the thickness t2 of the dielectric layer 12d2 may be about 3.0 nm and the thickness t3 of the dielectric layer 12d3 may be about 1.5 nm.

In some embodiments, the capping layer 12c may be spaced apart from the substrate 10 by a distance ranging from approximately 8.5 nm to approximately 10.5 nm.

Figure 1E:
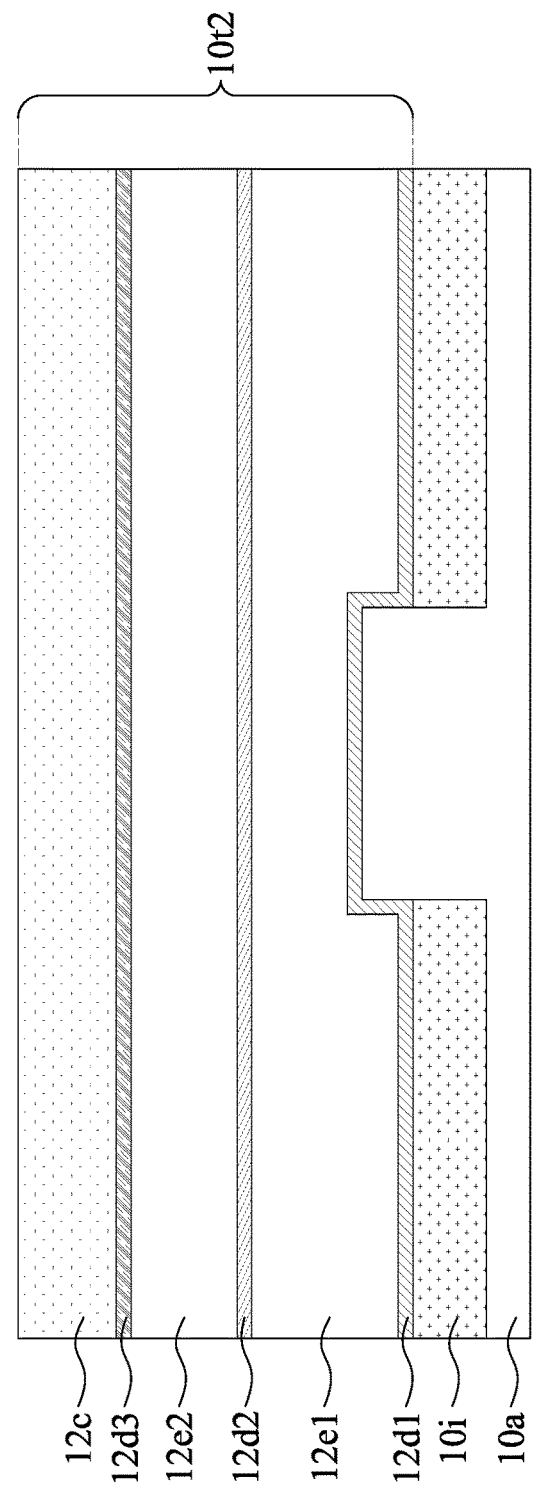
FIG. 1E is a schematic cross-sectional view illustrating the semiconductor device taken along a B-B' line shown in FIG. 1A.

FIG. 1E is a schematic cross-sectional view illustrating the semiconductor device taken along a B-B' line shown in FIG. 1A.

Referring to FIG. 1E, the trench 10t2 extends through one of the active regions 10a and the isolation region 10i. The trench 10t2 may have a fin structure in which the active region 10a protrudes more than the isolation region 10i. In other words, a depth of the passing gate, which runs across the isolation region 10i, is greater than a depth of the main gate, which runs across active region 10a. Accordingly, the trench for the gate structure 12 has different depths for a main gate region and a passing gate region.

The fin structure may increase the channel width and improve the electrical characteristics. In some embodiments, the fin structure may be omitted.

Figure 2:
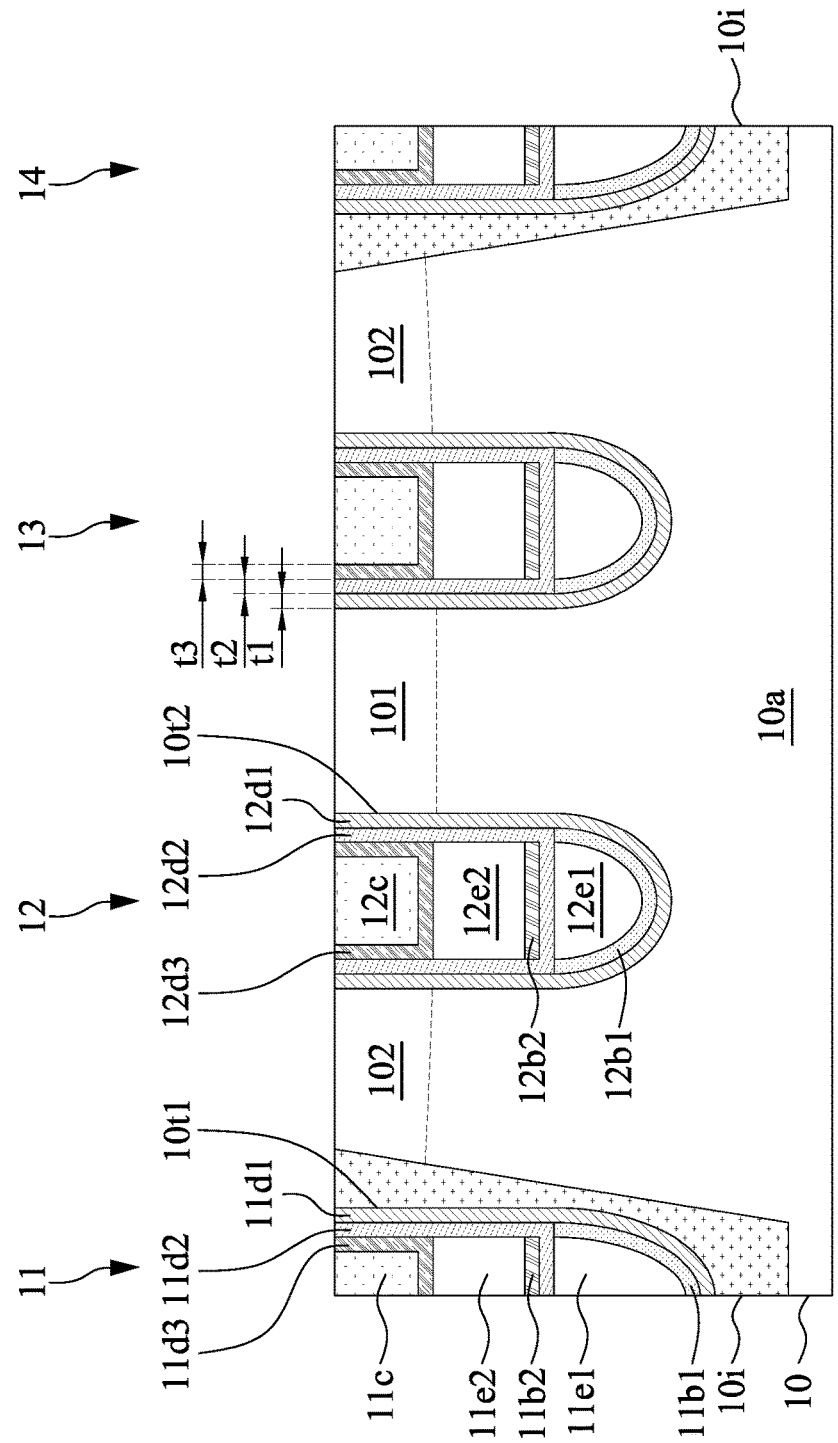
FIG. 2 is a schematic cross-sectional view of a semiconductor device in accordance with some embodiments of the present disclosure.

FIG. 2 is a schematic cross-sectional view of a semiconductor device 2 in accordance with some embodiments of the present disclosure. The semiconductor device 2 of FIG. 2 is similar to the semiconductor device 1 of FIG. 1, except for the differences described below.

The gate structure 12 of the semiconductor device 2 further includes a barrier layer 12b1 disposed between the dielectric layer 12d1 and the gate electrode 12e1. The barrier layer 12b1 may be conformally formed on the surface of the dielectric layer 12d1. The base portion of the dielectric layer 12d2 may be disposed on the barrier layer 12b1. The base portion of the dielectric layer 12d2 may contact the barrier layer 12b1.

In some embodiments, the barrier layer 12b1 may include a metal-based material. The barrier layer 12b1 may include metal nitride. The barrier layer 12b1 may include titanium nitride (TiN) or tantalum nitride (TaN).

The gate structure 12 of the semiconductor device 2 further includes a barrier layer 12b2 disposed between the dielectric layer 12d2 and the gate electrode 12e2. The barrier layer 12b2 may be disposed on the base portion of the dielectric layer 12d2.

A distance (i.e., the thickness t1 and the thickness t2) between the barrier layer 12b2 and the substrate 10 may be greater than the distance (i.e., the thickness t1) between the barrier layer 12b1 and the substrate 10. For example, the barrier layer 12b2 and the barrier layer 12b1 may be spaced apart from the substrate 10 by different distances.

The barrier layers 12b1 and 12b2 may be formed of the same material or different materials. In some embodiments, the barrier layer 12b2 may include a metal-based material. The barrier layer 12b2 may include metal nitride. The barrier layer 12b2 may include titanium nitride (TiN) or tantalum nitride (TaN), tungsten nitride (WN) or combinations thereof.

Figure 3:
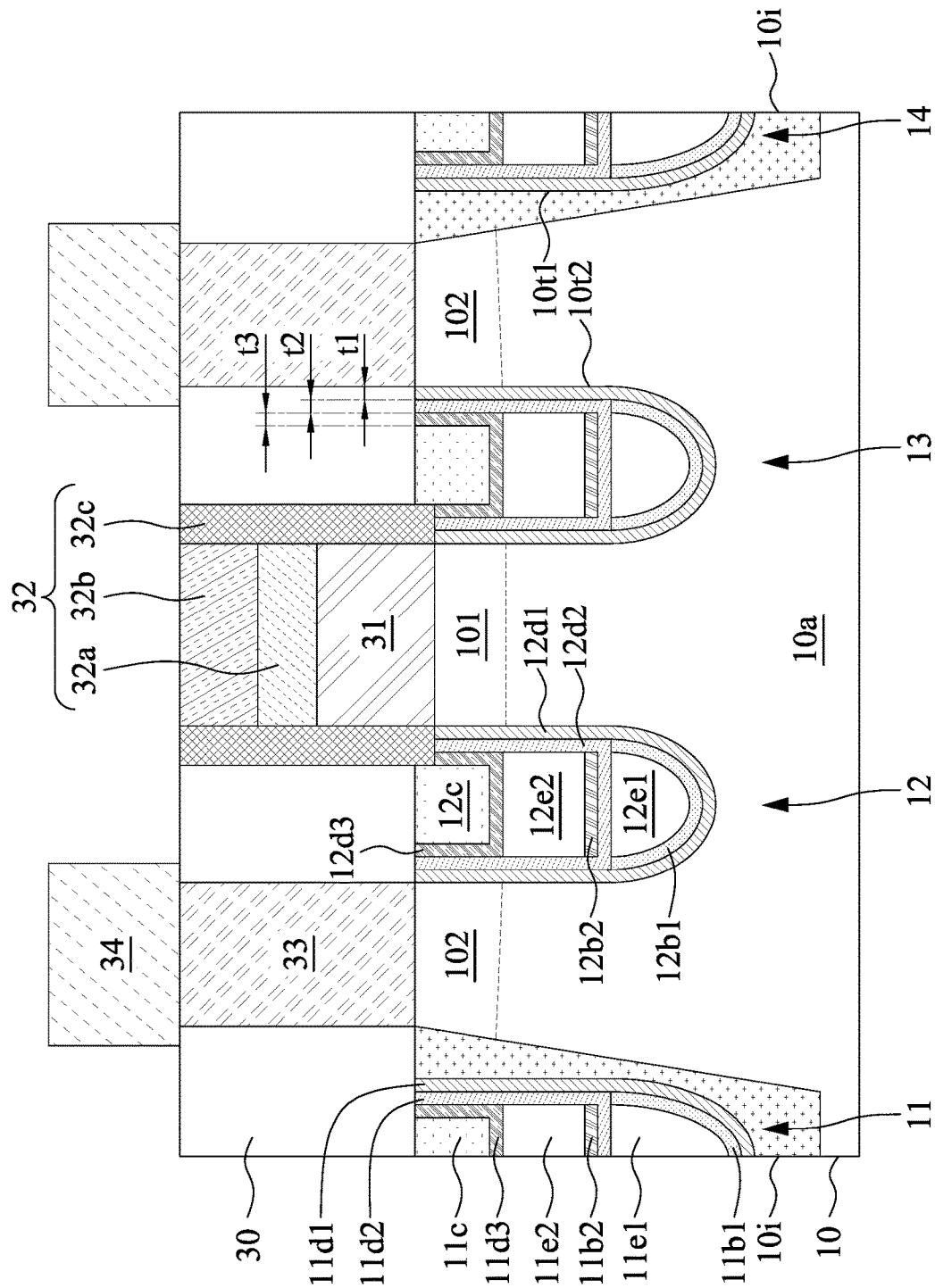
FIG. 3 is a schematic cross-sectional view of a semiconductor device in accordance with some embodiments of the present disclosure.

FIG. 3 is a schematic cross-sectional view of a semiconductor device 3 in accordance with some embodiments of the present disclosure. The semiconductor device 3 of FIG. 3 is similar to the semiconductor device 1 of FIG. 1, except for the differences described below.

The semiconductor device 3 may further include an isolation layer 30, contact plugs 31, 33, a bit-line structure 32, and a memory element 34.

The isolation layer 30 may be a single layer or a multi-layer. The isolation layer 30 may include silicon oxide ($SiO_2$), silicon nitride ($Si_3N_4$), silicon oxynitride ($N_2OSi_2$), silicon nitride oxide ($N_2OSi_2$), etc. The isolation layer 30 may serve to isolate adjacent contact plugs 33 from each other.

The contact plug 31 may be electrically connected with the bit-line structure 32 and the first doped region 101. The bit-line structure 32 may include a bit-line 32a, a bit line hard mask layer 32b and a spacer 32c. The bit-line 32a may include at least one material selected among a polysilicon (poly-Si), a metal silicide, a metal nitride and a metal. The bit line hard mask layer 32b may include a silicon oxide or a silicon nitride. The spacer 32c may include a dielectric material. The spacer 32c may contact the dielectric layer 12d1, the dielectric layer 12d2 and/or the dielectric layer 12d3.

The contact plug 33 may be electrically connected with the memory element 34 and the second doped region 102.

In some embodiments, the contact plugs 31 and 33 may include a suitable conductive material. For example, the contact plugs 31 and 33 may include tungsten (W), copper (Cu), aluminum (Al), silver (Ag), an alloy thereof, or a combination thereof.

The memory element 34 may be a capacitor. Accordingly, the memory element 34 may include a storage node which contacts the contact plug 33. The storage node may have a cylinder shape or a pillar shape. A capacitor dielectric layer may be formed on the surface of the storage node.

As the DRAM device becomes more highly integrated, it becomes more difficult to isolate a main gate (such as an electrode of the gate structure 12) in a memory cell from a passing gate (such as an electrode of the gate structure 11) in an adjacent memory cell. For example, when a passing gate is turned on, an inversion layer may be created that may extend the source/drain junction, creating an internal electric field. GIDL may be accelerated by the internal electric field.

By forming a thicker dielectric layer (i.e., the dielectric layers 12d1, 12d2 and 12d3) between the capping layer and the substrate, the effective electric field may be reduced and hence GIDL may be lowered. Therefore, interference between word-lines in different memory cells can be avoided, a data retention time can be extended, and the operational reliability of the semiconductor device can also be improved.

In addition, the dielectric layer (e.g., the dielectric layer 12d1) between the lower gate electrode and the substrate can have a constant thickness, which helps to optimize the subthreshold swing and decrease the threshold voltage. Therefore, the channel ions (e.g., the channel ions in the channel CH) can be increased. For example, number, amount, density or flow of electron between doped regions can be increased. For example, the channel ions can be increased by 20%, 40%, 60% or more assuming that the external resistance and the internal trap charges (or the internal trap density) are constant.

FIGS. 4A, 4B, 4C, 4D, 4E, 4F, 4G, 4H, 4I, 4J, 4K, 4L, 4M, 4N, 4O and 4P illustrate stages of a method of manufacturing a semiconductor device in accordance with some embodiments of the present disclosure. At least some of these figures have been simplified for a better understanding of the aspects of the present disclosure. In some embodiments, the semiconductor device 3 in FIG. 3 may be manufactured by the operations described below with respect to FIGS. 4A, 4B, 4C, 4D, 4E, 4F, 4G, 4H, 4I, 4J, 4K, 4L, 4M, 4N, 4O and 4P.

Figure 4A:
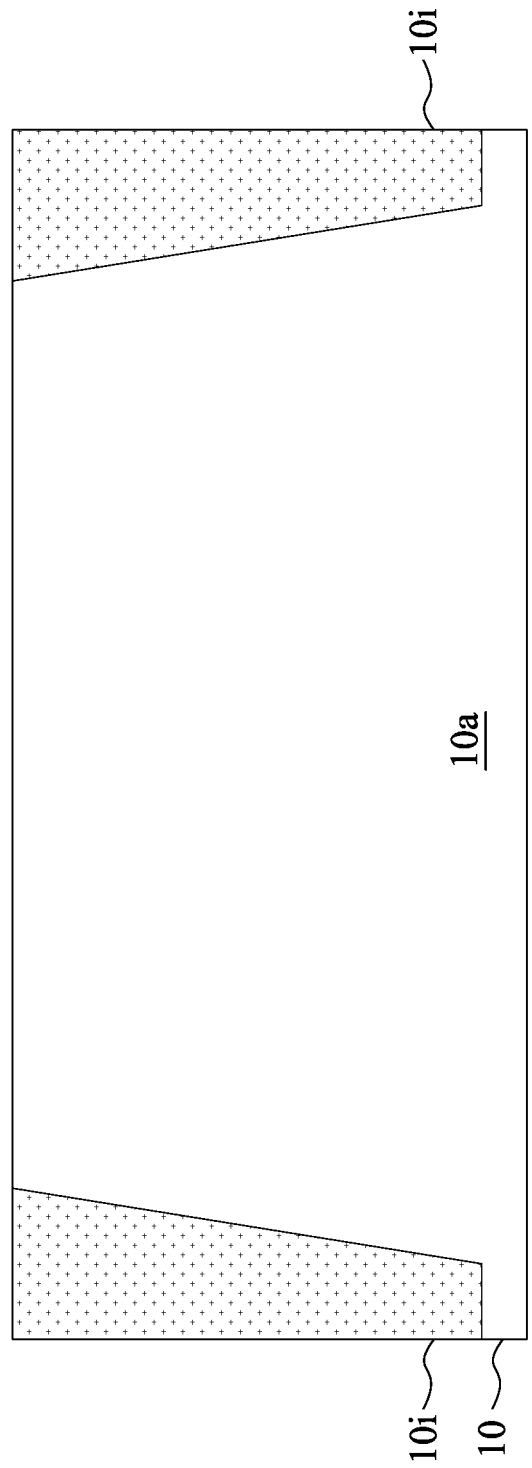
FIG. 4A illustrates one or more stages of a method of manufacturing a semiconductor device in accordance with some embodiments of the present disclosure.

As shown in FIG. 4A, the isolation region 10i is formed in the substrate 10. The active region 10a is defined by the isolation region 10i. The isolation region 10i may be formed through an STI (shallow trench isolation) process. For example, after a pad layer (not shown) is formed on the substrate 10, the pad layer and the substrate 10 are etched using an isolation mask (not shown) to define an isolation trench. The isolation trench is filled with a dielectric material, and accordingly, the isolation region 10i is formed.

A wall oxide, a liner and a gap-fill dielectric may be sequentially formed as the isolation region 10i. The liner may be formed by stacking silicon oxide ($SiO_2$) and silicon nitride ($Si_3N_4$). The gap-fill dielectric may include a SOD material. In another embodiment of the present invention, in the isolation region 10i, a silicon nitride may be used as the gap-fill dielectric. The isolation trench may be filled with a dielectric material through a chemical vapor deposition (CVD) process. Also, a planarization process such as chemical-mechanical polishing (CMP) may be additionally performed.

Figure 4B:
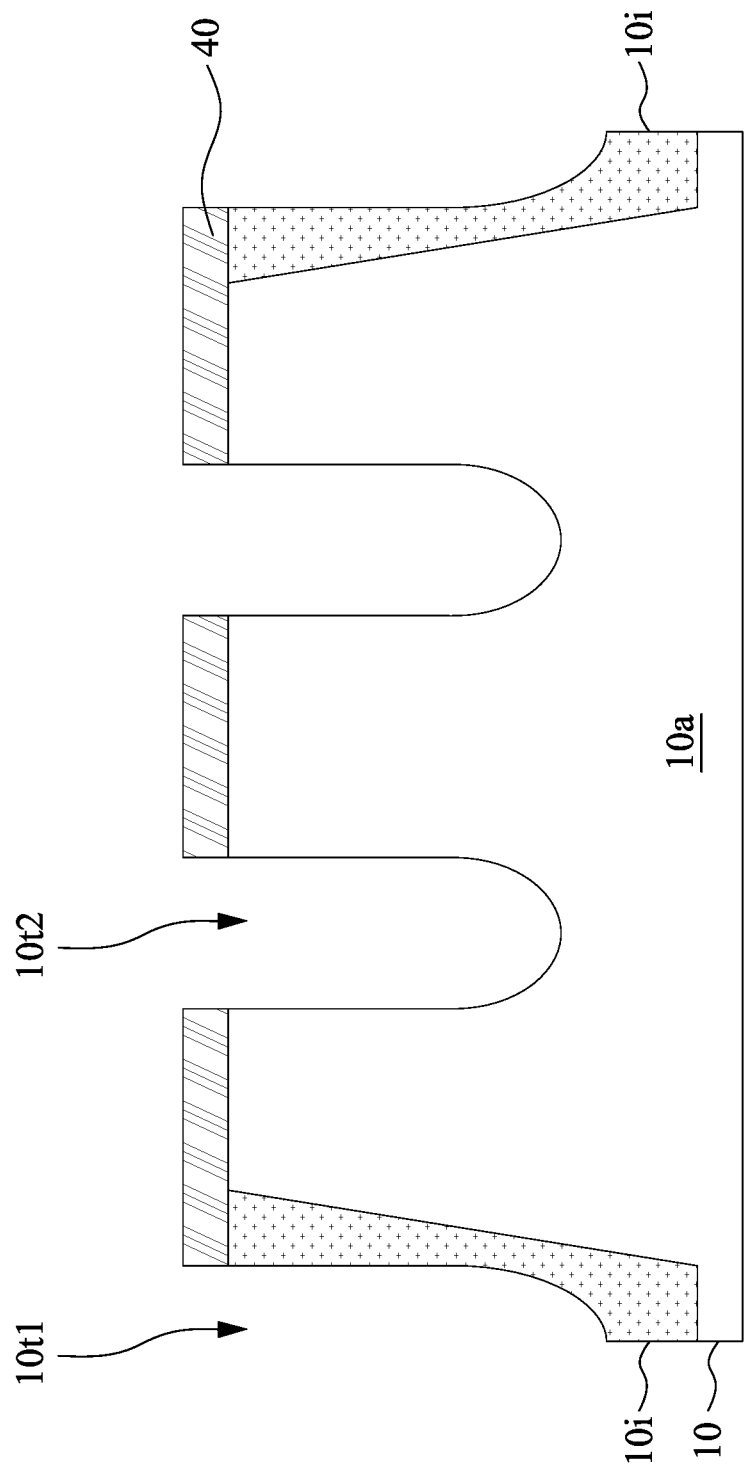
FIG. 4B illustrates one or more stages of a method of manufacturing a semiconductor device in accordance with some embodiments of the present disclosure.

Referring to FIG. 4B, a plurality of trenches 10t1 and 10t2 may then be formed in the substrate 10. Each of the trenches 10t1 and 10t2 may have a line shape crossing the active region 10a and the isolation region 10i. Each of the trenches 10t1 and 10t2 may be formed by an etch process of the substrate 10 using a hard mask layer 40 as an etch mask. The hard mask layer 40 may be formed on the substrate 10, and have line-shaped openings. The hard mask layer 40 may be formed of a material having an etch selectivity to the substrate 10. Each of the trenches 10t1 and 10t2 may be formed to be shallower than the isolation trench. In some embodiments, the bottom edge of each of the trenches 10t1 and 10t2 may have a curvature.

The active region 10a and the isolation region 10i may be simultaneously etched to form the trenches 10t1 and 10t2. In some embodiments, the isolation region 10i is more deeply etched than the active region 10a due to an etch selectivity between the active region and the isolation region 10i. Therefore, the gate trench may have a fin structure in which the active region 10a protrudes further than the isolation region 10i in the gate trench.

Figure 4C:
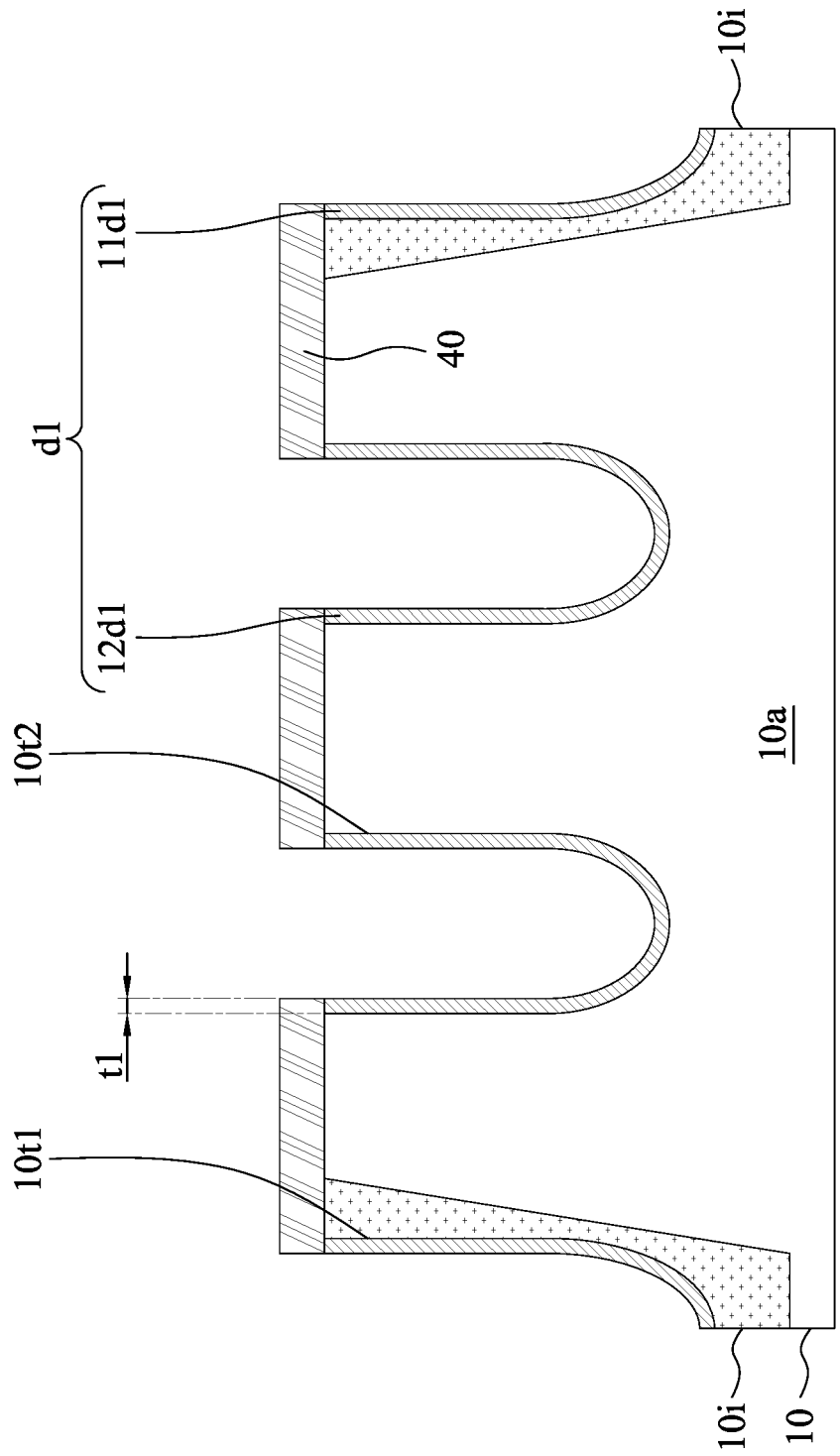
FIG. 4C illustrates one or more stages of a method of manufacturing a semiconductor device in accordance with some embodiments of the present disclosure.

Referring to FIG. 4C, a dielectric layer d1 may be formed on the surface of each of the trenches 10t1 and 10t2. Before the dielectric layer d1 is formed, the inside surface of each of the trenches 10t1 and that is damaged from the etch process may be recovered. For example, sacrificial oxide may be formed by a thermal oxidation treatment, and then the sacrificial oxide may be removed.

The dielectric layer d1 may be formed by a thermal oxidation process, such as an in situ steam generation (ISSG) oxidation process. In some embodiments, the dielectric layer d1 may be formed by a deposition process, such as a CVD process or an ALD process.

Figure 4D:
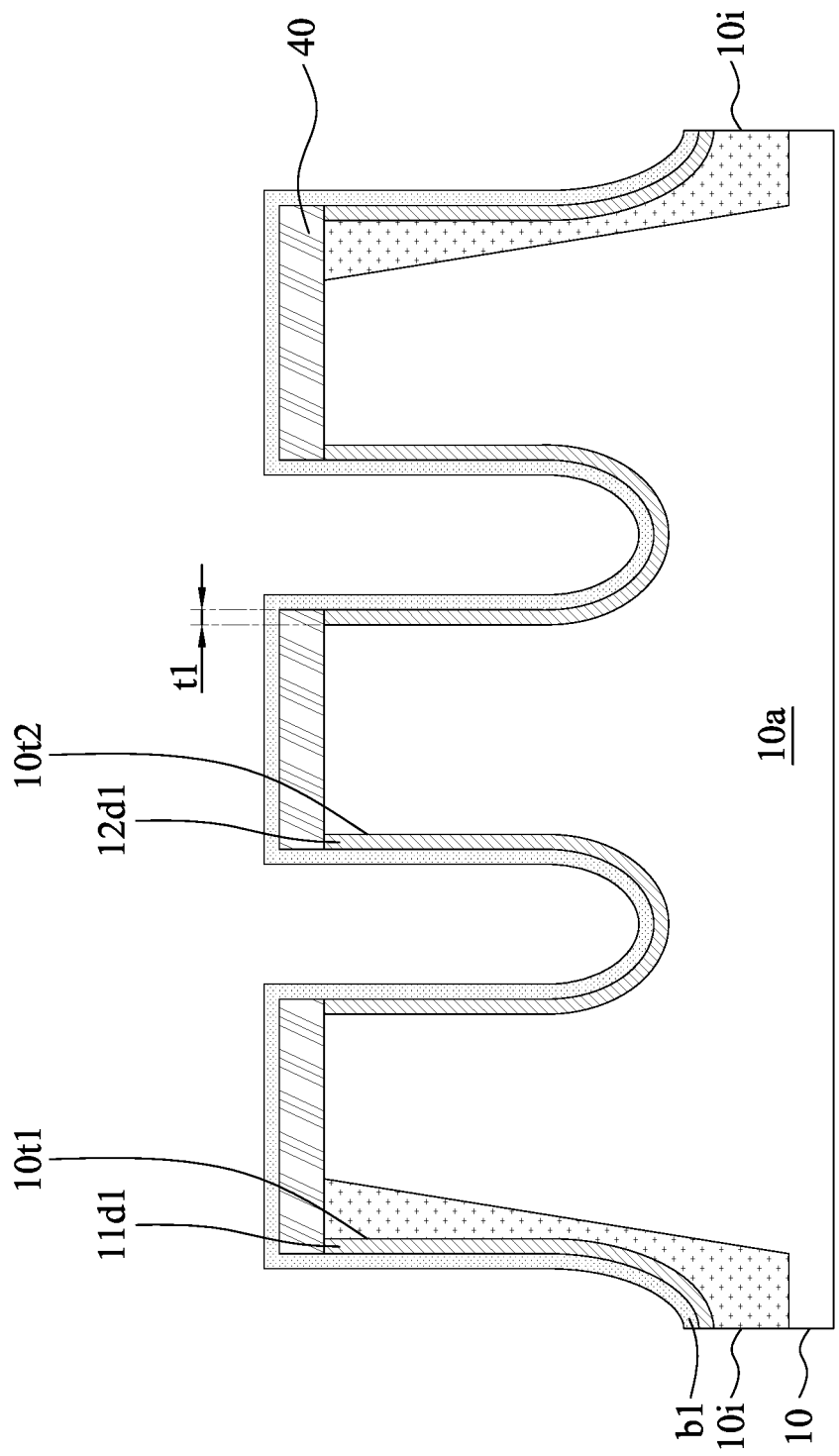
FIG. 4D illustrates one or more stages of a method of manufacturing a semiconductor device in accordance with some embodiments of the present disclosure.

Referring to FIG. 4D, a barrier layer b1 may be formed on the dielectric layer d1 and the hard mask layer 40. The barrier layer b1 may be conformally formed on the surface of the dielectric layer d1. The barrier layer b1 may be formed by the ALD or CVD process.

Figure 4E:
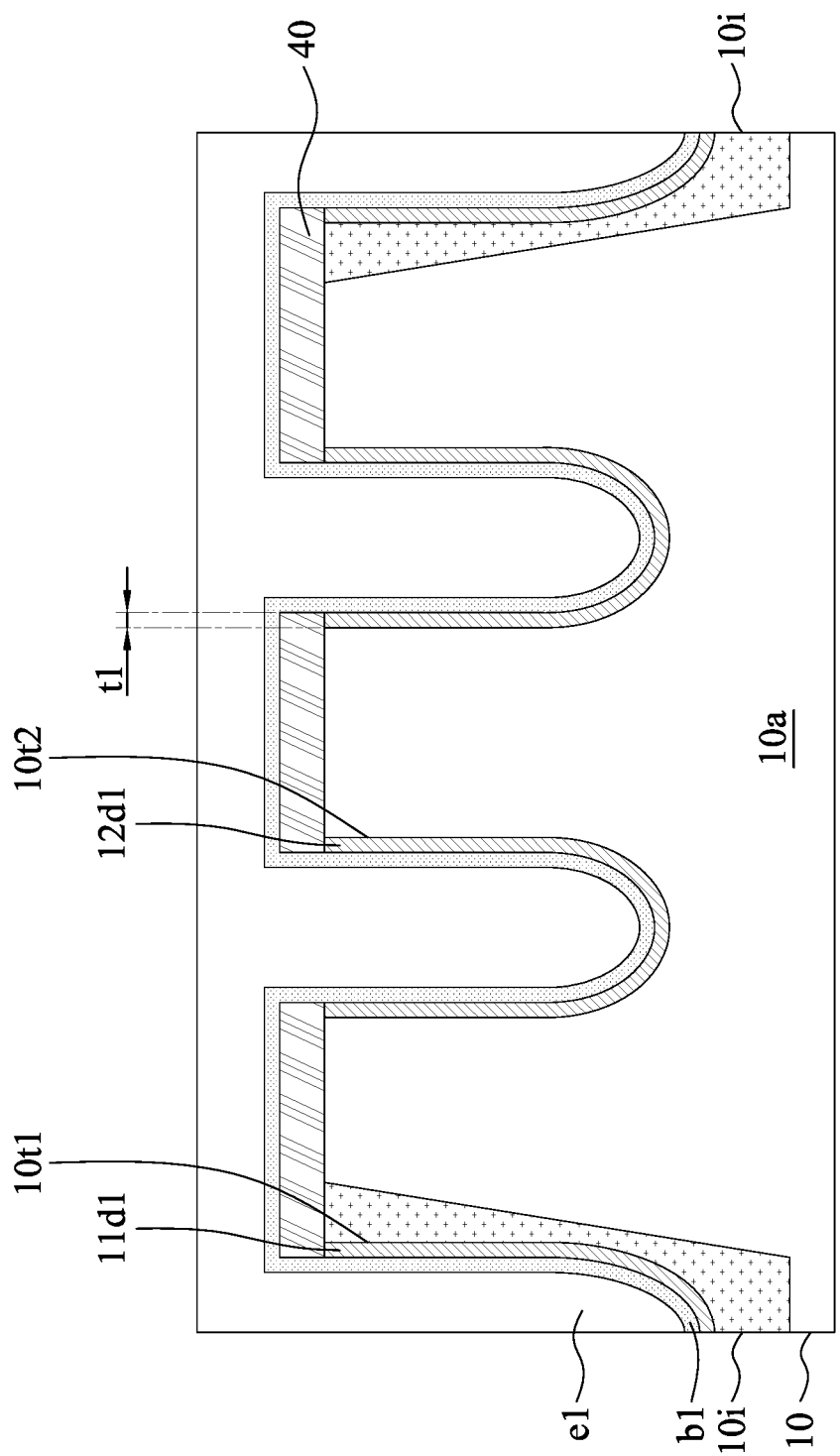
FIG. 4E illustrates one or more stages of a method of manufacturing a semiconductor device in accordance with some embodiments of the present disclosure.

Referring to FIG. 4E, a conductive layer e1 may be formed on the barrier layer b1. The conductive layer e1 may be formed on the barrier layer b1 to fill each of the trenches 10t1 and 10t2. The conductive layer e1 may include a low-resistance metal material. The conductive layer e1 may include tungsten (W). The conductive layer e1 may be formed by the CVD or ALD process.

Figure 4F:
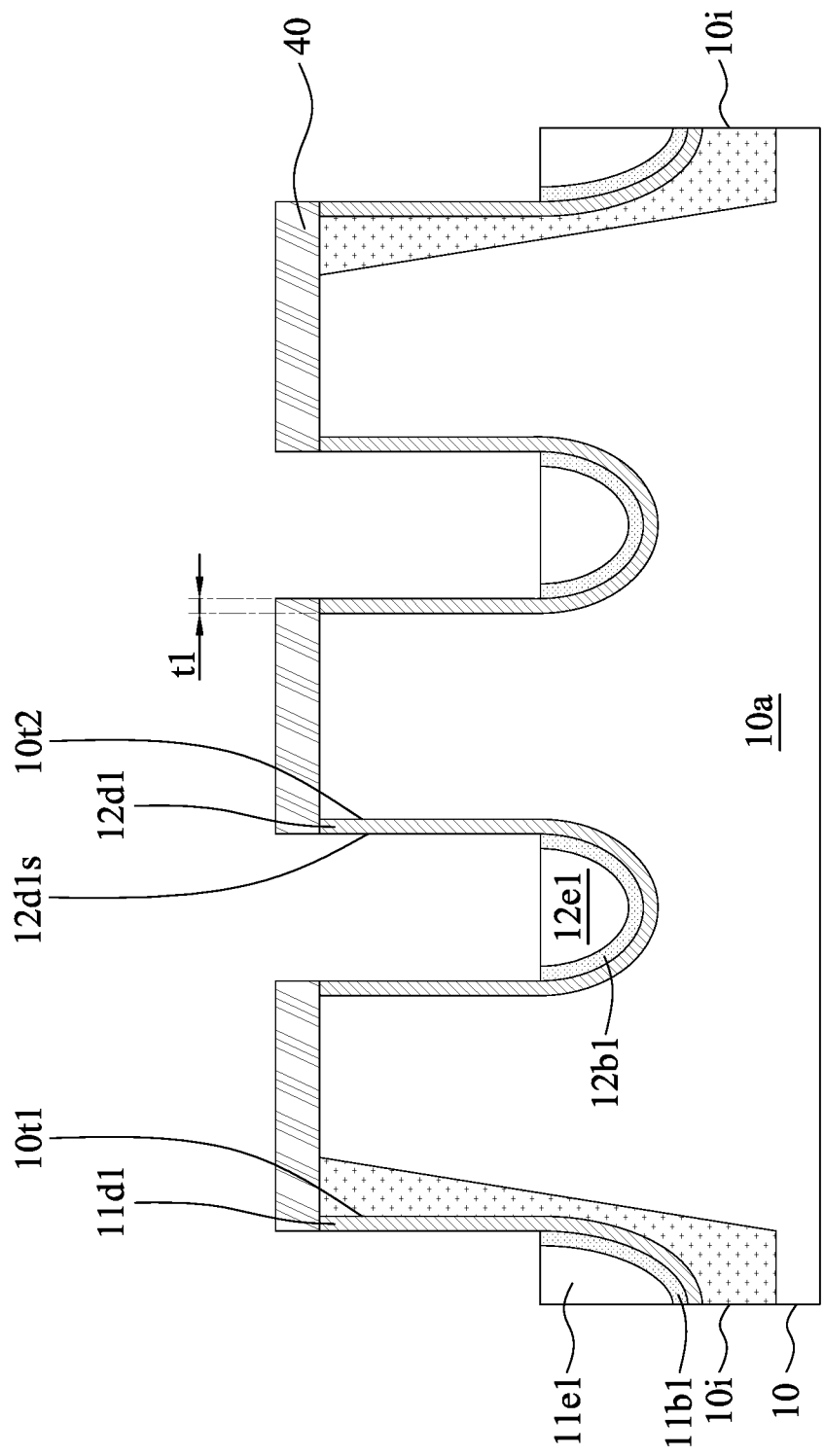
FIG. 4F illustrates one or more stages of a method of manufacturing a semiconductor device in accordance with some embodiments of the present disclosure.

Referring to FIG. 4F, a recessing process may be performed. The recessing process may be performed by a dry etch process, for example, an etch-back process. The barrier layers 11b1 and 12b1 may be formed by performing the etch-back process on the barrier layer b1. The gate electrodes 11e1 and 12e1 may be formed by performing the etch-back process on the conductive layer e1.

The barrier layer 11b1 and the gate electrode 11e1 may be formed inside the trench 10t1. The top surfaces of the barrier layer 11b1 and the gate electrode 11e1 may be substantially coplanar or located at the same level. The barrier layer 12b1 and the gate electrode 12e1 may be formed inside the trench 10t2. The top surfaces of the barrier layer 12b1 and the gate electrode 12e1 may be substantially coplanar or located at the same level.

In some embodiments, a planarization process may be performed in advance to expose the top surface of the hard mask layer and then the etch-back process may be performed.

After the barrier layer 12b1 and the gate electrode 12e1 are formed, a surface 12d1s of the dielectric layer 12d1 may be partially exposed.

Figure 4G:
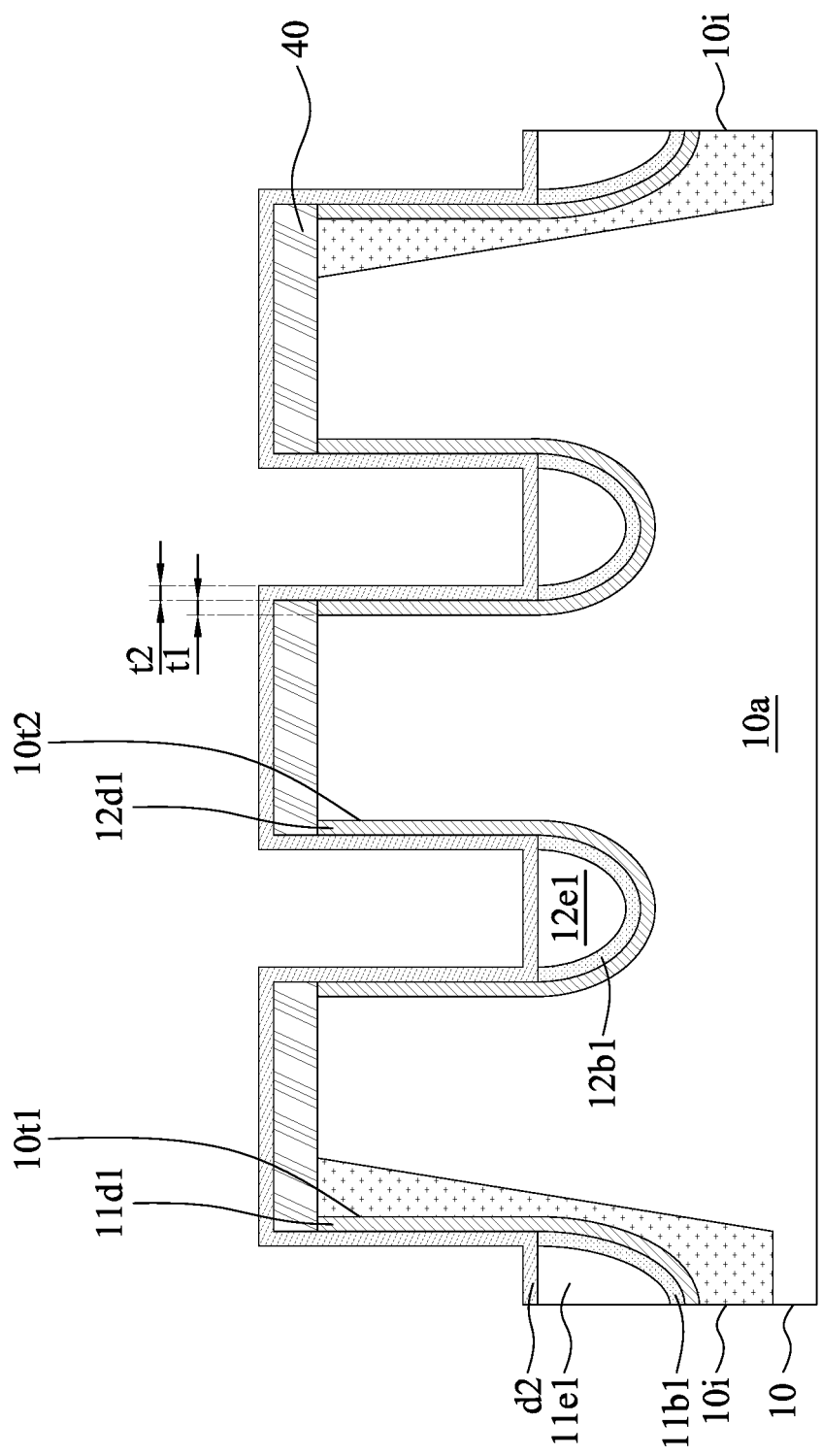
FIG. 4G illustrates one or more stages of a method of manufacturing a semiconductor device in accordance with some embodiments of the present disclosure.

Referring to FIG. 4G, a dielectric layer d2 may be formed on the barrier layer 12b1 and the gate electrode 12e1. The dielectric layer d2 may directly contact the barrier layer 12b1 and the gate electrode 12e1. The dielectric layer d2 may directly contact the surface 12d1s of the dielectric layer 12d1. The dielectric layer d2 may be formed by ALD or CVD.

Figure 4H:
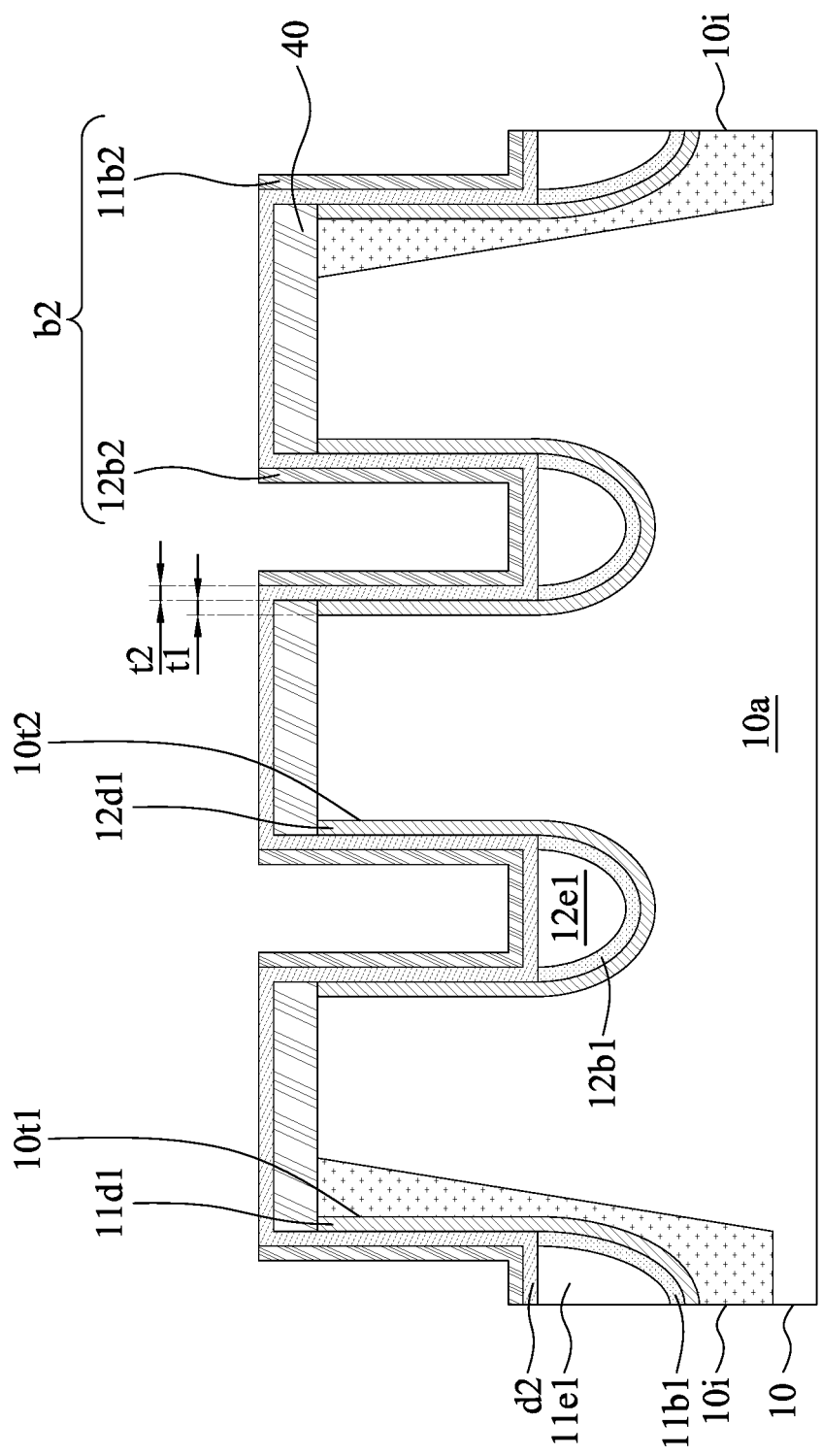
FIG. 4H illustrates one or more stages of a method of manufacturing a semiconductor device in accordance with some embodiments of the present disclosure.

Referring to FIG. 4H, a barrier layer b2 may be formed on the dielectric layer d2. The dielectric layer d2 may be disposed between the barrier layer b2 and the gate electrode 12e1. The barrier layer b2 may be non-conformally formed. The non-conformal barrier layer b2 may be formed by physical vapor deposition (PVD).

Figure 4I:
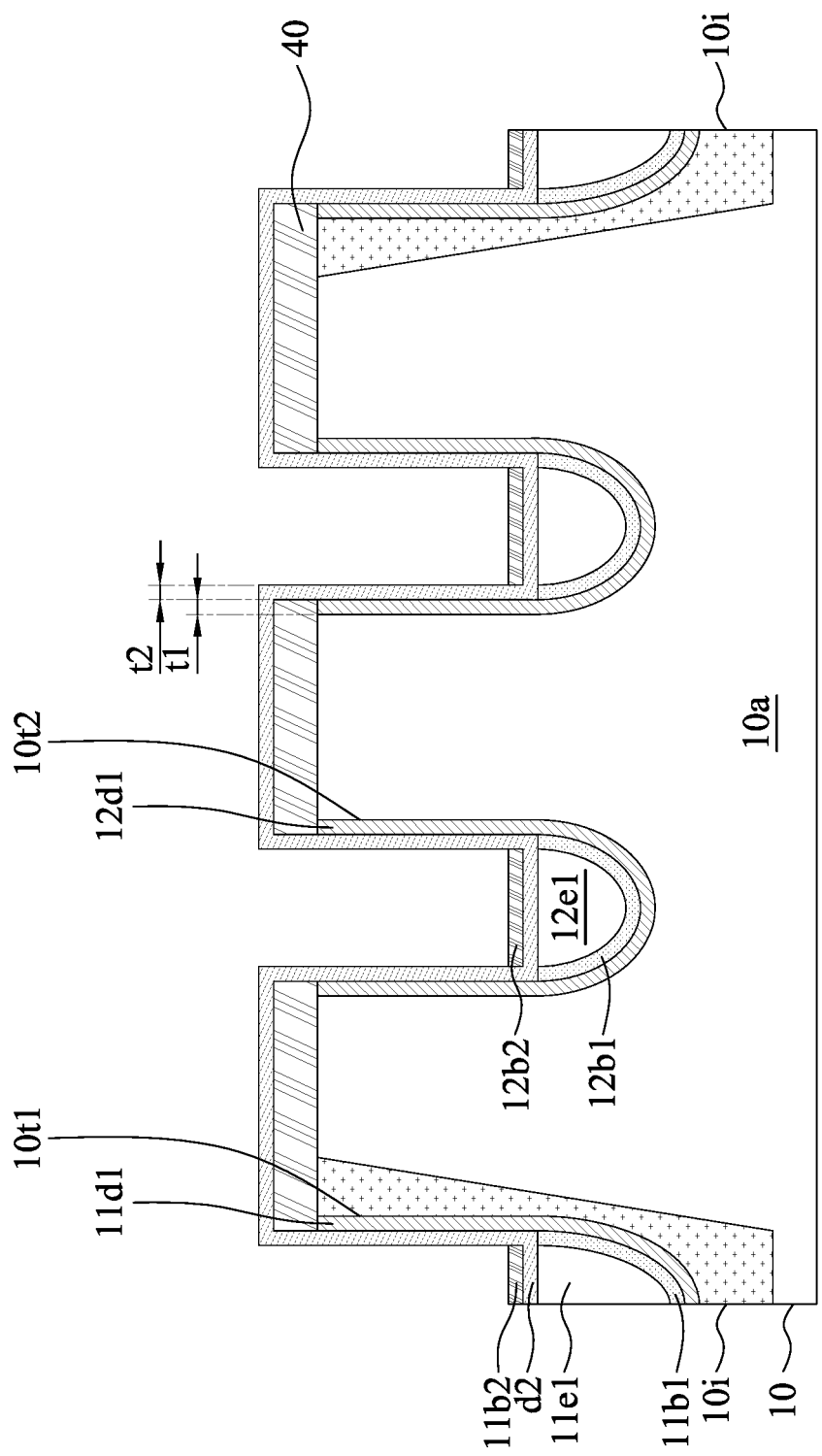
FIG. 4I illustrates one or more stages of a method of manufacturing a semiconductor device in accordance with some embodiments of the present disclosure.

Referring to FIG. 4I, a part of the barrier layer b2 may be removed to expose a part of the dielectric layer d2. For example, an etch process may be performed on the barrier layer b2. Therefore, the barrier layer 11b1 and the barrier layer 11b2 may remain on the bottom surface of the dielectric layer d2.

Figure 4J:
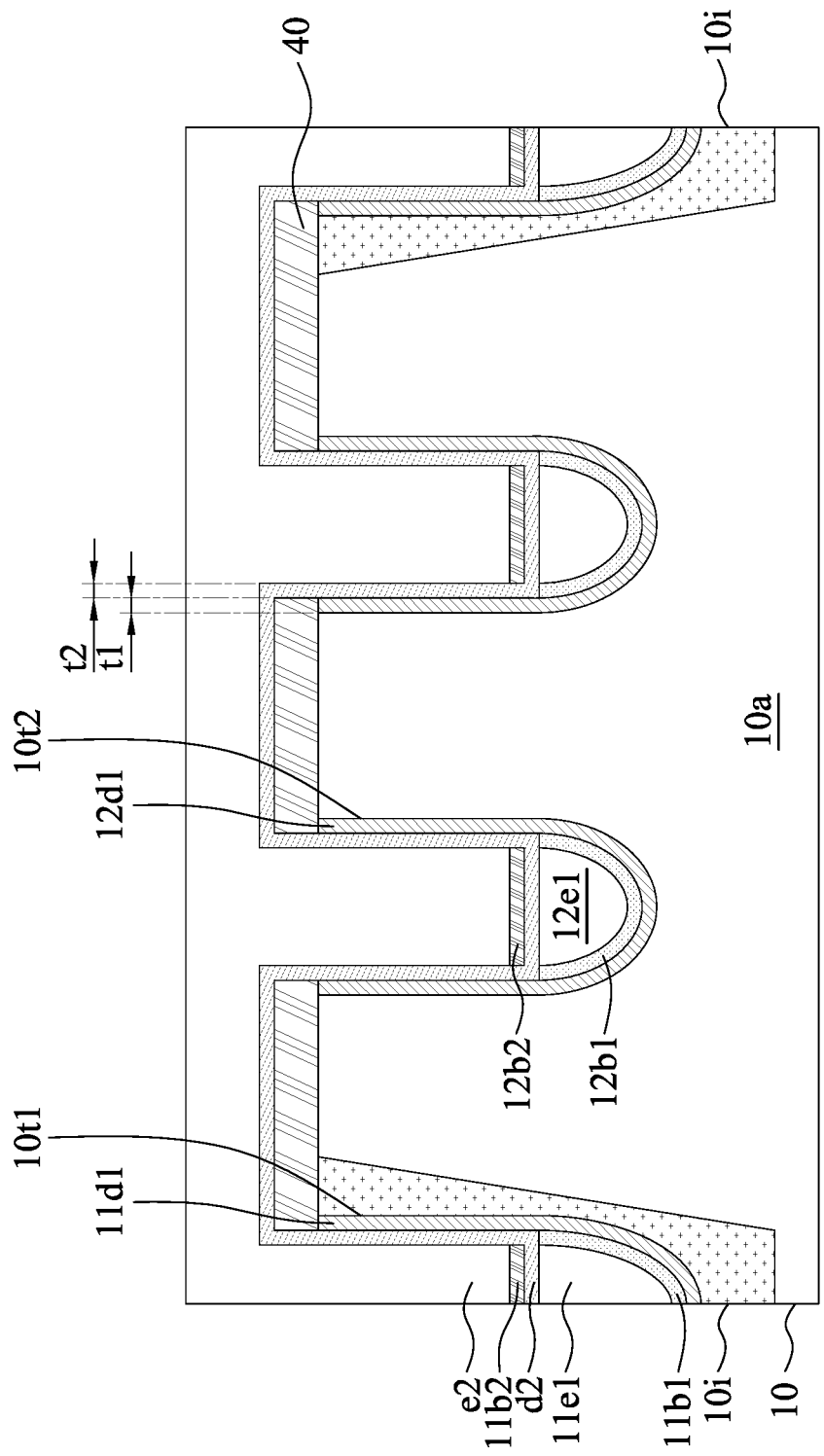
FIG. 4J illustrates one or more stages of a method of manufacturing a semiconductor device in accordance with some embodiments of the present disclosure.

Referring to FIG. 4J, a conductive layer e2 may be formed on the barrier layer 11b1, the barrier layer 11b2 and the dielectric layer 2. The conductive layer e2 may fill each trench. The conductive layer e2 may include a material having a low work function. The conductive layer e2 may include polysilicon having a low work function, for example, polysilicon doped with an N-type impurity. The conductive layer e2 may be formed by CVD or ALD.

Figure 4K:
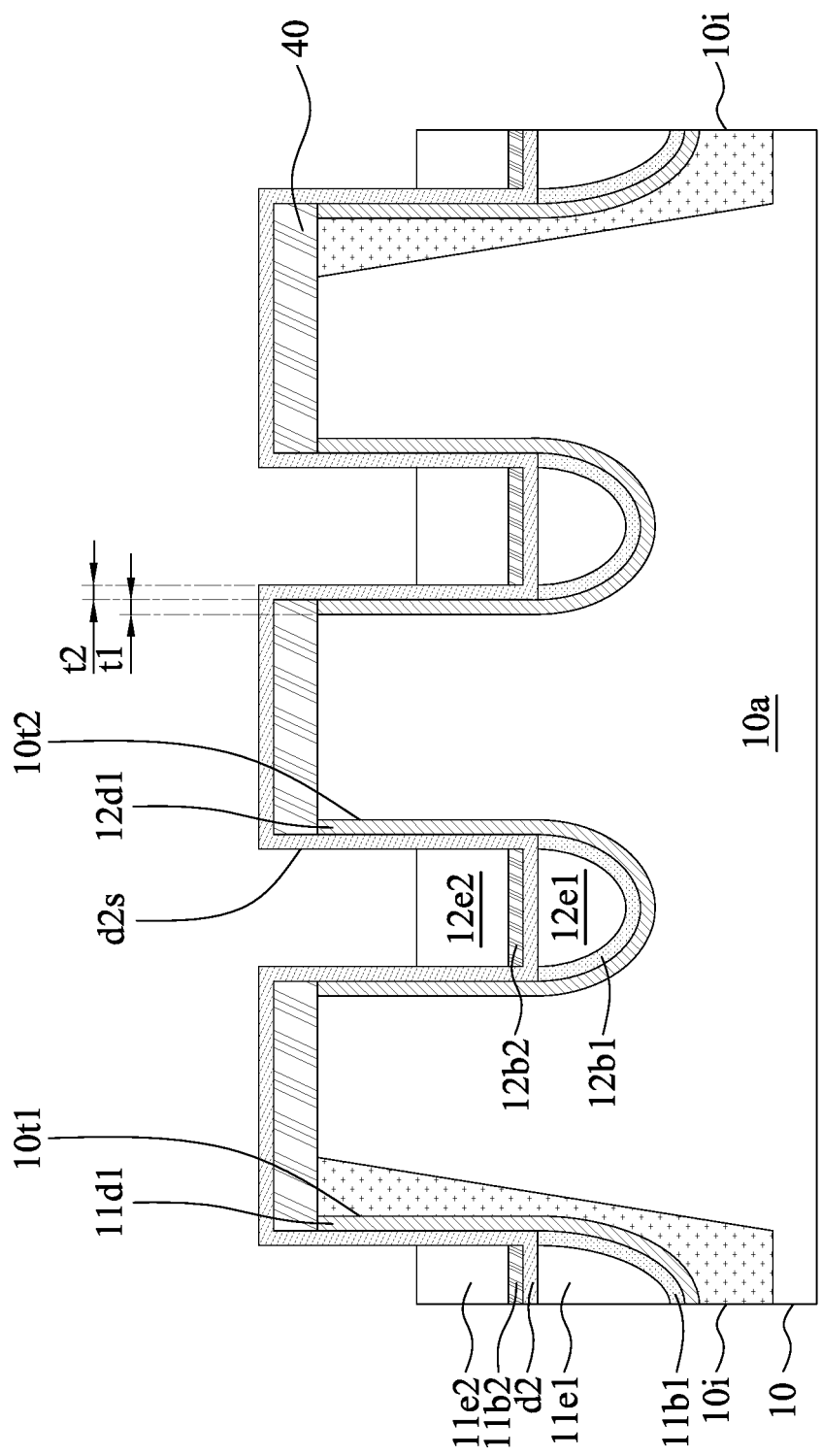
FIG. 4K illustrates one or more stages of a method of manufacturing a semiconductor device in accordance with some embodiments of the present disclosure.

Referring to FIG. 4K, a recessing process may be performed. The recessing process may be performed by a dry etch process, for example, an etch-back process. The gate electrodes 11e2 and 12e2 may be formed by performing the etch-back process on the conductive layer e2. After the gate electrode 12e2 is formed, a surface d2s of the dielectric layer d2 may be partially exposed.

Figure 4L:
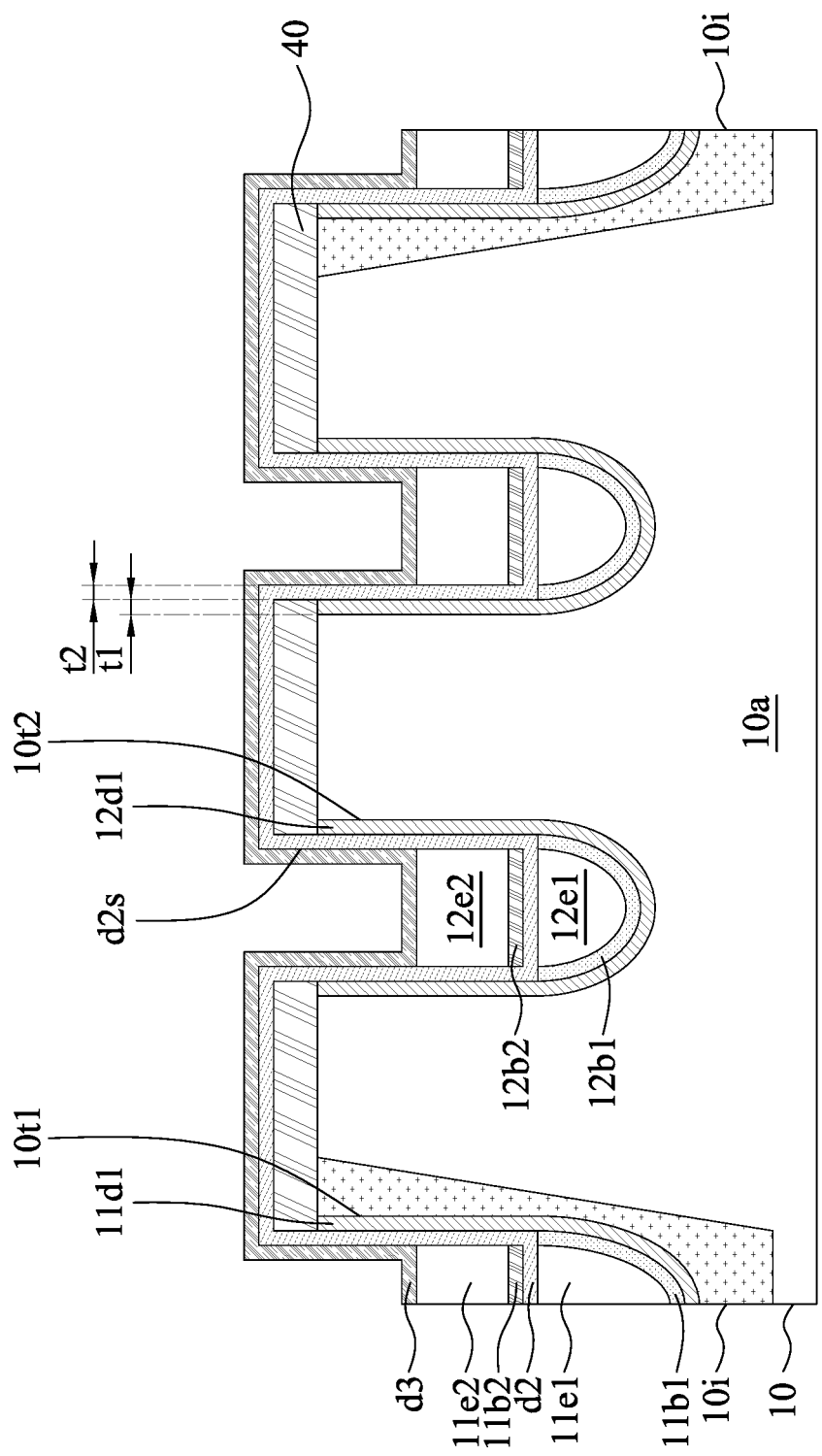
FIG. 4L illustrates one or more stages of a method of manufacturing a semiconductor device in accordance with some embodiments of the present disclosure.

Referring to FIG. 4L, a dielectric layer d3 may be formed on the gate electrode 12e2. The dielectric layer d3 may directly contact the gate electrode 12e2. The dielectric layer d3 may directly contact the surface d2s of the dielectric layer d2. The dielectric layer d3 may be formed by ALD or CVD.

Figure 4M:
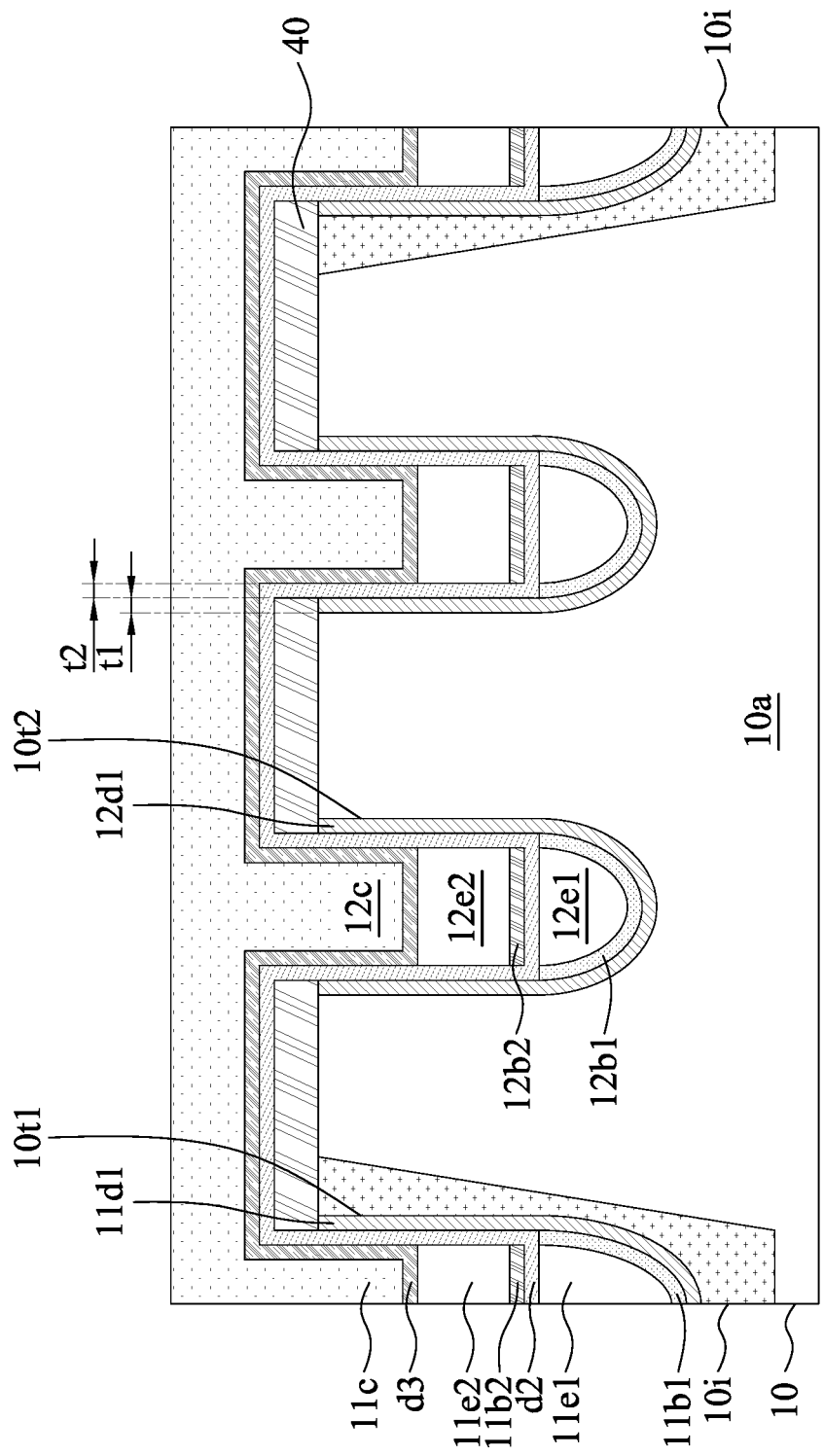
FIG. 4M illustrates one or more stages of a method of manufacturing a semiconductor device in accordance with some embodiments of the present disclosure.

Referring to FIG. 4M, the capping layers 11c and 12c may be formed on the dielectric layer d3.

Figure 4N:
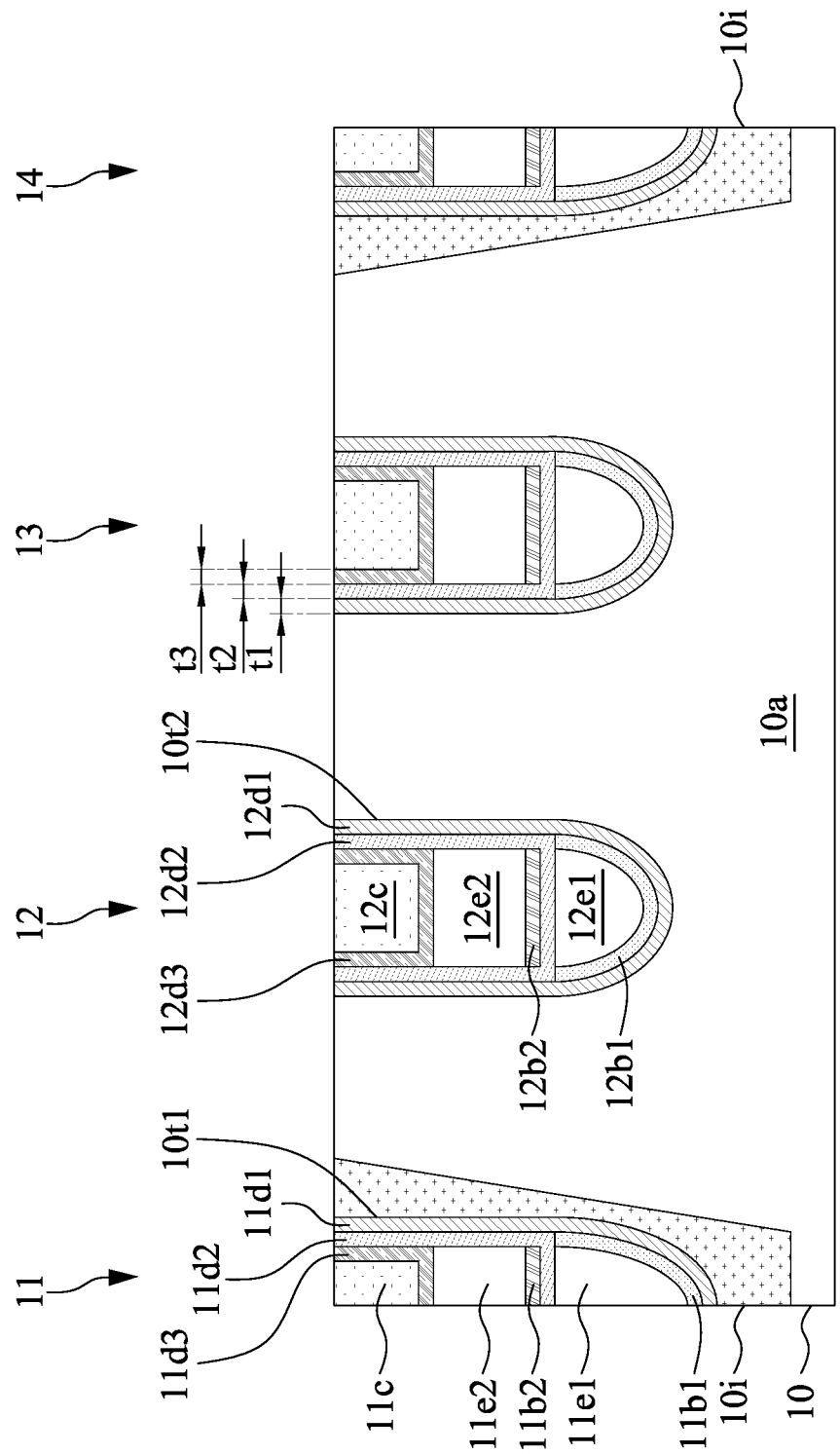
FIG. 4N illustrates one or more stages of a method of manufacturing a semiconductor device in accordance with some embodiments of the present disclosure.

Referring to FIG. 4N, the capping layer 24 may be planarized and the hard mask layer 40 may be removed so that the top surface of the dielectric layers 12d1, 12d2 and 12d3 is exposed. Through a series of processes described above, buried gate structures 11, 12, 13 and 14 may be formed.

Figure 4O:
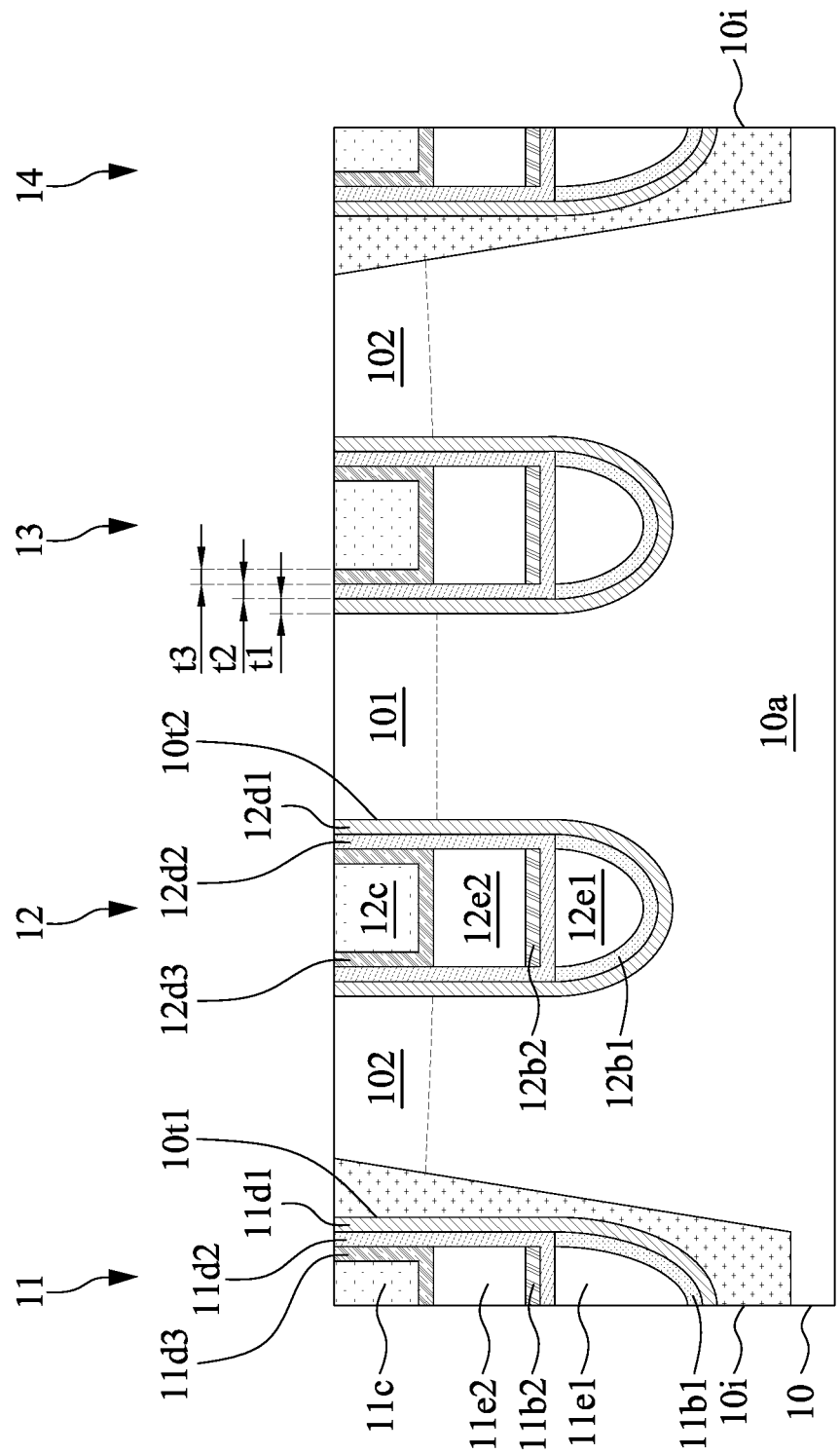
FIG. 4O illustrates one or more stages of a method of manufacturing a semiconductor device in accordance with some embodiments of the present disclosure.

Referring to FIG. 4O, a doping process of an impurity is performed by implantation or other doping technique. Accordingly, the first doped region 101 and second doped region 102 are formed in the substrate 10.

In some embodiments, the first doped region 101 and second doped region 102 may be formed subsequent to other operations described. For example, the first doped region 101 and second doped region 102 may be formed subsequent to one of the operations in FIGS. 4A, 4B, 4C, 4D, 4E, 4F, 4G, 4H, 4I, 4J, 4K, 4L and 4M.

Figure 4P:
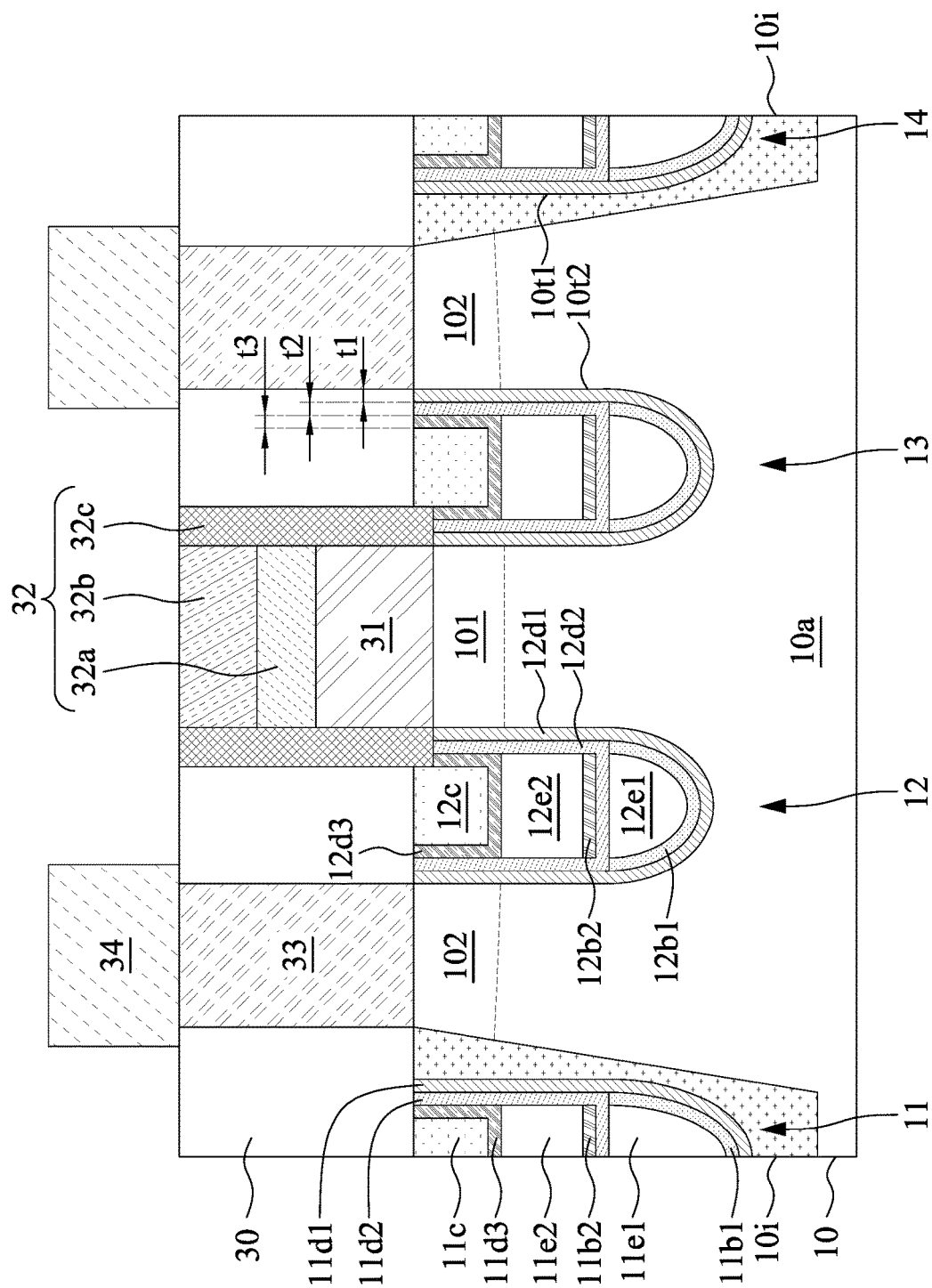
FIG. 4P illustrates one or more stages of a method of manufacturing a semiconductor device in accordance with some embodiments of the present disclosure.

Referring to FIG. 4P, the isolation layer 30 may be formed on the top surface of the structure from FIG. 4N by, for example, ALD, CVD, PVD, remote plasma CVD (RPCVD), plasma enhanced CVD (PECVD), coating, etc. The isolation layer 30 may be patterned to define the locations of the contact plugs 31, 33 formed in the subsequent operations. The contact plug 31 may be disposed over the first doped region 101. The contact plug 33 may be disposed over the second doped region 102. Then, the bit-line structure 32 may be electrically connected with the contact plug 31. The memory element 34 may be electrically connected with the contact plug 33.

In some embodiments, subsequent to the formation of the memory element 34, a wiring layer (not shown in the figures) may be formed on the memory element 34. For example, the wiring layer may have a multilayer wiring structure which includes a plurality of wiring layers and interlayer insulating films.

Figure 5:
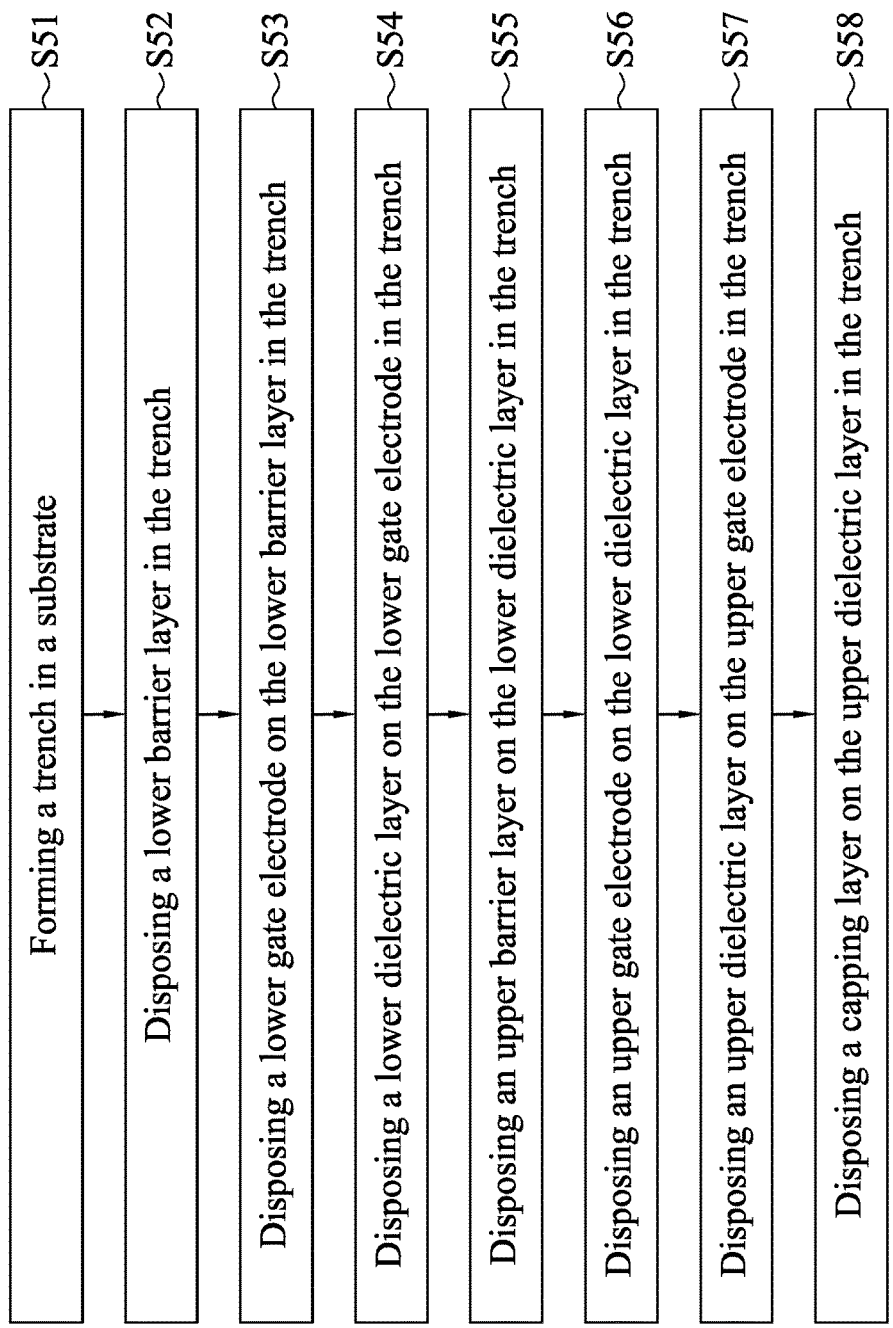
FIG. 5 illustrates a flow chart of a method of manufacturing a semiconductor device in accordance with some embodiments of the present disclosure.

FIG. 5 illustrates a flow chart of a method 50 of manufacturing a semiconductor device in accordance with some embodiments of the present disclosure.

In some embodiments, the method 50 may include a step S51 of forming a trench in a substrate. For example, as shown in FIG. 4B, the plurality of trenches 10t1 and 10t2 may be formed in the substrate 10.

In some embodiments, the method 50 may include a step S52 of disposing a lower barrier layer in the trench. For example, as shown in FIG. 4D, the barrier layer b1 may be formed on the dielectric layer d1 and the hard mask layer 40. The barrier layer b1 may be disposed in the trenches 10t1 and 10t2.

In some embodiments, the method 50 may include a step S53 of disposing a lower gate electrode on the first barrier layer in the trench. For example, as shown in FIG. 4E, the conductive layer e1 may be formed on the barrier layer b1. For example, as shown in FIG. 4F, the gate electrodes 11e1 and 12e1 may be formed by performing the etch-back process on the conductive layer e1. In some embodiments, the barrier layers 11b1 and 12b1 may be formed by performing the etch-back process on the barrier layer b1.

In some embodiments, the method 50 may include a step S54 of disposing a lower dielectric layer on the lower gate electrode in the trench. For example, as shown in FIG. 4G, the dielectric layer d2 may be formed on the barrier layer 12b1 and the gate electrode 12e1. Similarly, the dielectric layer d2 may be formed on the barrier layer 11b1 and the gate electrode 11e1.

In some embodiments, the method 50 may include a step S55 of disposing an upper barrier layer on the dielectric layer in the trench. For example, as shown in FIG. 4H, the barrier layer b2 may be formed on the dielectric layer d2. For example, as shown in FIG. 4I, the barrier layer 11b1 and the barrier layer 11b2 may remain on the bottom surface of the dielectric layer d2.

In some embodiments, the method 50 may include a step S56 of disposing an upper gate electrode on the lower dielectric layer in the trench. For example, as shown in FIG. 4J, the conductive layer e2 may be formed on the barrier layer 11b1, the barrier layer 11b2 and the dielectric layer 2. For example, as shown in FIG. 4K, the gate electrodes 11e2 and 12e2 may be formed by performing the etch-back process on the conductive layer e2.

In some embodiments, the method 50 may include a step S57 of disposing an upper dielectric layer on the upper gate electrode in the trench. For example, as shown in FIG. 4L, the dielectric layer d3 may be formed on the gate electrode 12e2.

In some embodiments, the method 50 may include a step S58 of disposing a capping layer on the upper dielectric layer in the trench. For example, as shown in FIG. 4M, the capping layers 11c and 12c may be formed on the dielectric layer d3. In FIG. 4N, the capping layer 24 may be planarized and the hard mask layer 40 may be removed so that the top surface of the dielectric layers 12d1, 12d2 and 12d3 is exposed.

One aspect of the present disclosure provides a semiconductor device. The semiconductor device includes a substrate having a trench and a gate structure in the trench. The gate structure includes an upper gate electrode, a capping layer on the upper gate electrode and a first dielectric layer partially disposed between the upper gate electrode and the capping layer.

Another aspect of the present disclosure provides a semiconductor device. The semiconductor device includes a substrate having a trench and a gate structure in the trench. The gate structure includes an upper gate electrode and a capping layer on the upper gate electrode. A distance between the capping layer and the substrate is greater than a distance between the upper gate electrode and the substrate.

Another aspect of the present disclosure provides a method of manufacturing a semiconductor device. The method includes forming a trench in a substrate and disposing an upper gate electrode in the trench. The method also includes disposing a first dielectric layer on the upper gate electrode in the trench and disposing a capping layer on the first dielectric layer in the trench.

Forming a thicker dielectric layer in the trench may reduce the effective electric field and consequently reduce GIDL. Therefore, interference between word-lines in different memory cells can be avoided. A data retention time can be extended, and the operational reliability of the semiconductor device can also be improved.

In addition, the gate structure also includes a lower gate electrode and a dielectric layer between the lower gate electrode and the substrate. The dielectric layer between the lower gate electrode and the substrate can have a constant thickness, which helps to optimize the subthreshold swing and decrease the threshold voltage. Therefore, the channel ions can be increased. For example, number, amount, density or flow of electron between doped regions can be increased. For example, the channel ions can be increased by 20%, 40%, 60% or more assuming that the external resistance and the internal trap charges (or the internal trap density) are constant.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate having a trench; and
   a gate structure in the trench, wherein the gate structure comprising:
   an upper gate electrode;
   a capping layer on the upper gate electrode; and
   a first dielectric layer partially disposed between the upper gate electrode and the capping layer;
   wherein the gate structure further comprises:
   a lower gate electrode spaced apart from the upper gate electrode;
   a second dielectric layer partially disposed between the upper gate electrode and the lower gate electrode; and
   a third dielectric layer disposed between the substrate and the lower gate electrode, wherein the second dielectric layer is disposed between the first dielectric layer and the third dielectric layer.

2. The semiconductor device of claim 1, wherein a distance between the capping layer and the substrate is greater than a distance between the upper gate electrode and the substrate, and a width of the capping layer is less than a width of the upper gate electrode.

3. The semiconductor device of claim 1, wherein the upper gate electrode is disposed between the first dielectric layer and the second dielectric layer.

4. The semiconductor device of claim 1, wherein a thickness of the first dielectric layer and a thickness of the second dielectric layer are substantially equal.

5. The semiconductor device of claim 4, wherein the thickness of the first dielectric layer and the thickness of the second dielectric layer are between about 1.5 nanometers (nm) and about 3.0 nm.

6. The semiconductor device of claim 1, wherein a thickness of the first dielectric layer is substantially double a thickness of the second dielectric layer, and the thickness of the first dielectric layer is about 3.0 nm and the thickness of the second dielectric layer is about 1.5 nm.

7. The semiconductor device of claim 1, wherein a thickness of the second dielectric layer is substantially double a thickness of the first dielectric layer, and the thickness of the second dielectric layer is about 3.0 nm and the thickness of the first dielectric layer is about 1.5 nm.

8. The semiconductor device of claim 1, wherein a thickness of the third dielectric layer is substantially constant, and the thickness of the third dielectric layer is about 4.0 nm.

9. The semiconductor device of claim 1, wherein the gate structure is disposed in an active region of the substrate.

10. The semiconductor device of claim 1, wherein the gate structure is disposed in an isolation region of the substrate.

* * * * *